United States Patent
Kagaya

(10) Patent No.: US 11,598,823 B2
(45) Date of Patent: Mar. 7, 2023

(54) CIRCUIT DEVICE, ELECTRONIC DEVICE, AND VEHICLE

(71) Applicant: SEIKO EPSON CORPORATION, Tokyo (JP)

(72) Inventor: Ryuichi Kagaya, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 163 days.

(21) Appl. No.: 17/079,804

(22) Filed: Oct. 26, 2020

(65) Prior Publication Data

US 2021/0123986 A1    Apr. 29, 2021

(30) Foreign Application Priority Data

Oct. 28, 2019  (JP) .............................. JP2019-194972
Apr. 27, 2020  (JP) .............................. JP2020-078071

(51) Int. Cl.
*G01R 31/68* (2020.01)
*G06F 13/42* (2006.01)
*G01R 19/10* (2006.01)

(52) U.S. Cl.
CPC ............. *G01R 31/68* (2020.01); *G01R 19/10* (2013.01); *G06F 13/4282* (2013.01); *G06F 2213/0042* (2013.01)

(58) Field of Classification Search
CPC ..... G01R 31/68; G01R 19/10; G06F 13/4282; G06F 2213/0042; G06F 13/4068
See application file for complete search history.

(56) References Cited

U.S. PATENT DOCUMENTS

| 11,087,670 | B2 * | 8/2021 | Mandlik | ................ G09G 3/035 |
| 2011/0148470 | A1 * | 6/2011 | Inoue | .................. H04L 25/0272 |
| | | | | 327/77 |
| 2012/0001588 | A1 * | 1/2012 | Kita | ........................ H03M 1/34 |
| | | | | 320/107 |
| 2019/0303330 | A1 * | 10/2019 | Kagaya | ............... G06F 13/4022 |

FOREIGN PATENT DOCUMENTS

JP          2011-129042          6/2011

* cited by examiner

*Primary Examiner* — Alvaro E Fortich
*Assistant Examiner* — Zannatul Ferdous
(74) *Attorney, Agent, or Firm* — Rankin, Hill & Clark LLP

(57) ABSTRACT

A circuit device includes an HS driver that is a USB HS-mode transmission circuit and a disconnection detection circuit that performs disconnection detection of USB. The disconnection detection circuit includes a holding circuit that measures and holds first voltage level information that is voltage level information of one signal out of a DP signal and a DM signal of the USB when the HS driver is transmitting a host chirp, a determination voltage generation circuit that generates a first determination voltage based on the first voltage level information, and a detection circuit that performs disconnection detection of the USB based on the first determination voltage and outputs a disconnection detection signal.

11 Claims, 22 Drawing Sheets

CIRCUIT DEVICE, ELECTRONIC DEVICE, AND VEHICLE

The present application is based on, and claims priority from JP Application Serial Number 2019-194972, filed Oct. 28, 2019 and JP Application Serial Number 2020-078071, filed Apr. 27, 2020, the disclosure of which is hereby incorporated by reference herein in its entirety.

BACKGROUND

1. Technical Field

The present invention relates to a circuit device, an electronic device, a vehicle, and the like.

2. Related Art

In USB (Universal Serial Bus), disconnection detection is performed in order to determine whether or not a device has been detached. Patent Document 1 discloses a communication apparatus that performs such USB disconnection detection. The communication apparatus in Patent Document 1 includes a reference voltage generation circuit that outputs a reference voltage that changes according to a control signal, a differential amplitude circuit that amplifies an input signal, and outputs, to a receptacle, a differential output signal that changes according to a control signal, and a disconnection detection circuit. The reference voltage generation circuit outputs, to the disconnection detection circuit, a reference voltage that is higher than a differential amplitude voltage when the receptacle is terminated and is lower than a differential amplitude voltage when the receptacle is open. When the differential amplitude voltage of the USB is higher than or equal to the reference voltage, the disconnection detection circuit outputs a disconnection detection signal. This Patent Document 1 discloses that, when the voltage level of the differential output signal is increased based on a control signal, the voltage level of the reference voltage that serves as a determination voltage for disconnection detection is increased according to the increased voltage level.

JP A-2011-1290420 is an example of the related art.

The internal resistances of hosts and devices in recent years have been increasing. In Patent Document 1, it is impossible to set a determination voltage for disconnection detection that can cope with such an increase in the internal resistance of a host or a device. Therefore, there is a risk that false detection for disconnection is made due to an increase in the internal resistance of a host or a device and the like.

SUMMARY

One aspect of the disclosure relates to a circuit device that includes: an HS driver that is a HS-mode transmission circuit of USB and a disconnection detection circuit that performs disconnection detection of the USB; and the disconnection detection circuit includes: a first holding circuit that measures and holds first voltage level information that is voltage level information of one signal out of a DP signal and a DM signal of the USB when the HS driver is transmitting a host chirp, a first determination voltage generation circuit that generates a first determination voltage based on the first voltage level information, and a detection circuit that performs disconnection detection of the USB based on the first determination voltage, and outputs a disconnection detection signal.

Also, one aspect of the disclosure relates to an electronic device that includes the above-described circuit device.

Also, one aspect of the disclosure relates to a vehicle that includes the above-described circuit device.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

The following describes embodiments of the present disclosure. Note that the embodiments described below are not intended to unduly limit the content recited in the claims, and all of the configurations described in the embodiments are not necessarily essential requirements.

Note that a configuration and operations of a disconnection detection circuit 30 of a circuit device 10 will be mainly described with reference to FIGS. 1 to 17. A case in which the circuit device 10 is provided in a host will be described as an example with reference to FIGS. 1 to 17. On the other hand, the circuit device 10 configured to include physical layer circuits 11 and 12 and a bus switch circuit 14 will be described with reference to FIGS. 18 to 22. In FIGS. 18 to 22, the circuit device 10 is provided between a host and a device.

1. Circuit Device

Figure 1:
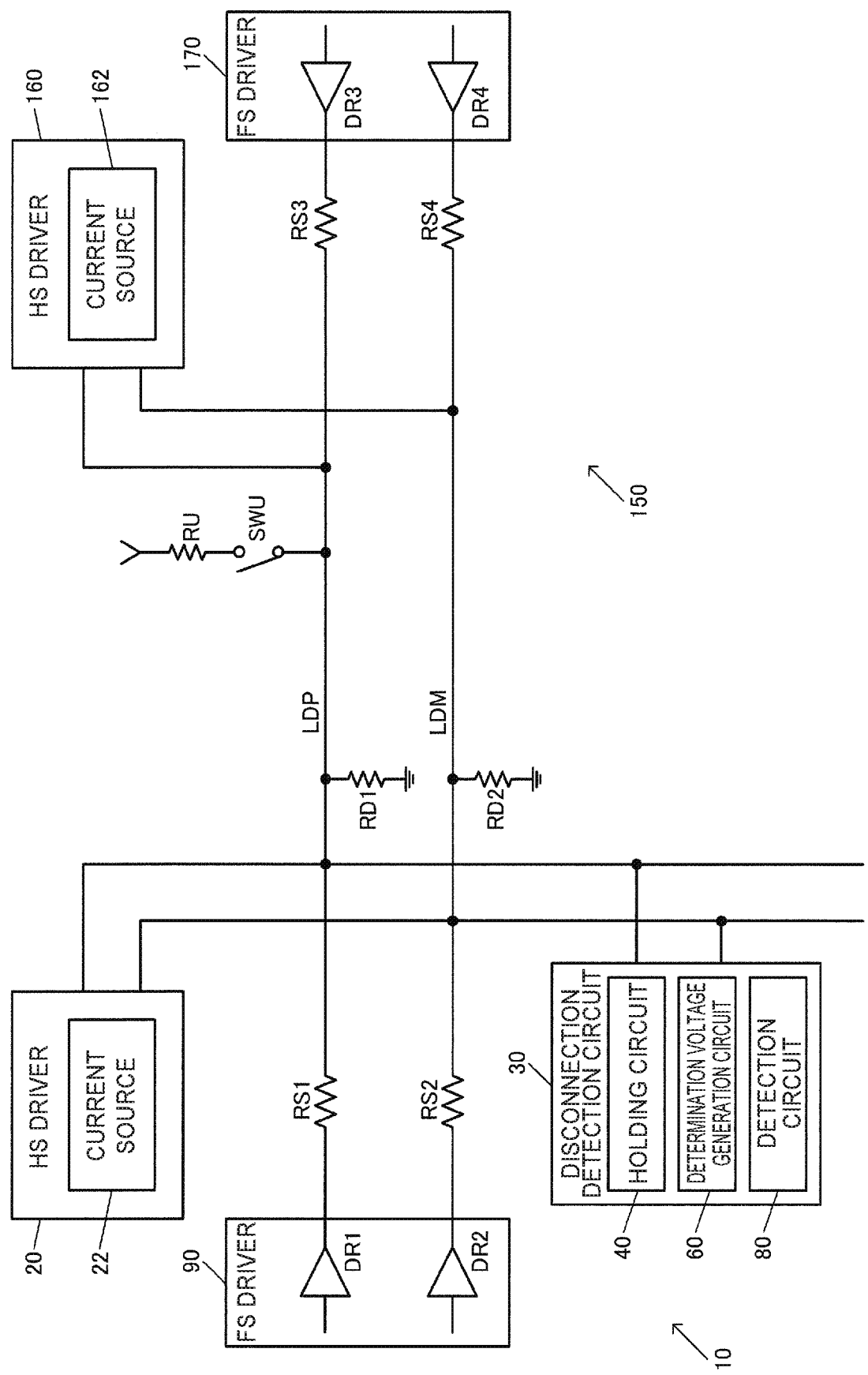
FIG. 1 shows a configuration example of a circuit device according to an embodiment of the disclosure.

FIG. 1 shows a configuration example of the circuit device 10 according to this embodiment. This circuit device 10 is a circuit device on a host side, and is provided in a USB host. On the other hand, a circuit device 150 is a circuit device on a device side, and is provided in a USB device. The circuit devices 10 and 150 are integrated circuit devices (ICs) that are realized by semiconductor circuits, for example.

As shown in FIG. 1, the circuit device 10 according to this embodiment includes an HS driver 20 and the disconnection detection circuit 30. The circuit device 10 may also include an FS driver 90, terminal resistors RS1 and RS2, and pull-down resistors RD1 and RD2.

The HS driver 20 is a USB HS (High Speed) mode transmission circuit, and is a current driver that outputs a drive current to signal lines LDP and LDM for a DP signal and a DM signal. The DP signal and the DM signal are USB differential output signals, and form a differential pair. The HS driver 20 includes a current source 22. The current source 22 is realized by a constant current circuit and the like. Also, the HS driver 20 may include, for example, a switch for selecting the signal line LDP or LDM as a signal line to which a drive current that is a current transmitted from the current source 22 is to be output.

The disconnection detection circuit 30 is a circuit that performs disconnection detection of the USB. Specifically, the disconnection detection circuit 30 is a circuit that performs detection of device disconnection, that is to say, a device being removed from the USB. The disconnection detection circuit 30 performs device disconnection detection by detecting the voltage levels of the DP signal and the DM signal.

The FS driver 90 is a USB FS (Full Speed) mode transmission circuit, and is a voltage driver that drives the voltages of the signal lines LDP and LDM. The FS driver 90 includes a driver circuit DR1 that drives the signal line LDP and a driver circuit DR2 that drives the signal line LDM. Note that the FS driver 90 is also used for an LS (Low Speed) mode, and is a driver for both the FS mode and the LS mode.

The terminal resistor RS1 is provided between the signal line LDP and an output node of the driver circuit DR1 of the FS driver 90, and the terminal resistor RS2 is provided between the signal line LDM and an output node of the driver circuit DR2 of the FS driver 90. The resistance value of each of the terminal resistors RS1 and RS2 is 45Ω. As a result of the FS driver 90 outputting a signal at an L level, which is a GND level, to one end of the terminal resistor RS1 or RS2, the terminal resistor RS1 or RS2 functions as a terminal resistor.

The pull-down resistor RD1 is provided between the signal line LDP and a GND node, and the pull-down resistor RD2 is provided between the signal line LDM and a GND node. Note that the terminal resistors RS1 and RS2 and the pull-down resistors RD1 and RD2 do not need to be incorporated in the circuit device 10, and may be external components of the circuit device 10.

The circuit device 150 on the device side includes an HS driver 160, an FS driver 170, terminal resistors RS3 and RS4, a pull-up resistor RU, and a switch SWU. The HS driver 160 is a USB HS-mode transmission circuit, and drives the currents on the signal lines LDP and LDM using a current source 162. The terminal resistor RS3 is provided between the signal line LDP and an output node of a driver circuit DR3 of the FS driver 170, and the terminal resistor RS4 is provided between the signal line LDM and an output node of a driver circuit DR4 of the FS driver 170. The pull-up resistor RU and the switch SWU are provided between a power source node and the signal line LDP.

Also, according to this embodiment, the disconnection detection circuit 30 includes a holding circuit 40, a determination voltage generation circuit 60, and a detection circuit 80. The holding circuit 40 is a first holding circuit, and the determination voltage generation circuit 60 is a first determination voltage generation circuit. When the HS driver 20 is transmitting a host chirp, the holding circuit 40 measures and holds first voltage level information, which is voltage level information of one signal out of the DP signal of the DM signal of the USB. The determination voltage generation circuit 60 then generates a first determination voltage based on the first voltage level information held in the holding circuit 40, and the detection circuit 80 performs disconnection detection of the USB based on the generated first determination voltage, and outputs a disconnection detection signal.

Accordingly, as will be described later in detail with reference to FIG. 10, the HS driver 20 on the host side outputs host chirp signal during a bus reset period after a cable is attached. At this time, the holding circuit 40 measures the voltage level of one signal out of the DP signal and the DM signal, and holds first voltage level information, which is information regarding the measured voltage level. The determination voltage generation circuit 60 determines a voltage level of a first determination voltage by, for example, performing predetermined computation processing based on the first voltage level information held in the holding circuit 40, and outputs a first determination voltage at the determined voltage level, to the detection circuit 80. The detection circuit 80 performs disconnection detection of the USB based on this first determination voltage. The detection circuit 80 performs disconnection detection of the USB for detecting whether or not device disconnection has occurred, in other words, whether or not the device has been removed during HS communication, for example. Specifically, disconnection detection of the USB is performed by comparing the voltage of the DP signal with the first determination voltage, or comparing the voltage of the DM signal with the first determination voltage. When device disconnection is detected through disconnection detection, a disconnection detection signal is turned to an active label, and is output. As described above, according to this embodiment, the first determination voltage that is a determination voltage for disconnection detection is generated based on a measurement result of the voltage level of one signal out of the DP signal and the DM signal when a host chirp is transmitted, and disconnection detection of the USB is performed using this first determination voltage. With such a configuration, it is possible to set an appropriate determination voltage for disconnection detection under the current connection condition. Therefore, for example, even in a connection configuration in which various components are added to a USB device, it is possible to prevent a false detection for disconnection from being made while a device is connected, and to maintain a stable connection state.

Figure 2:
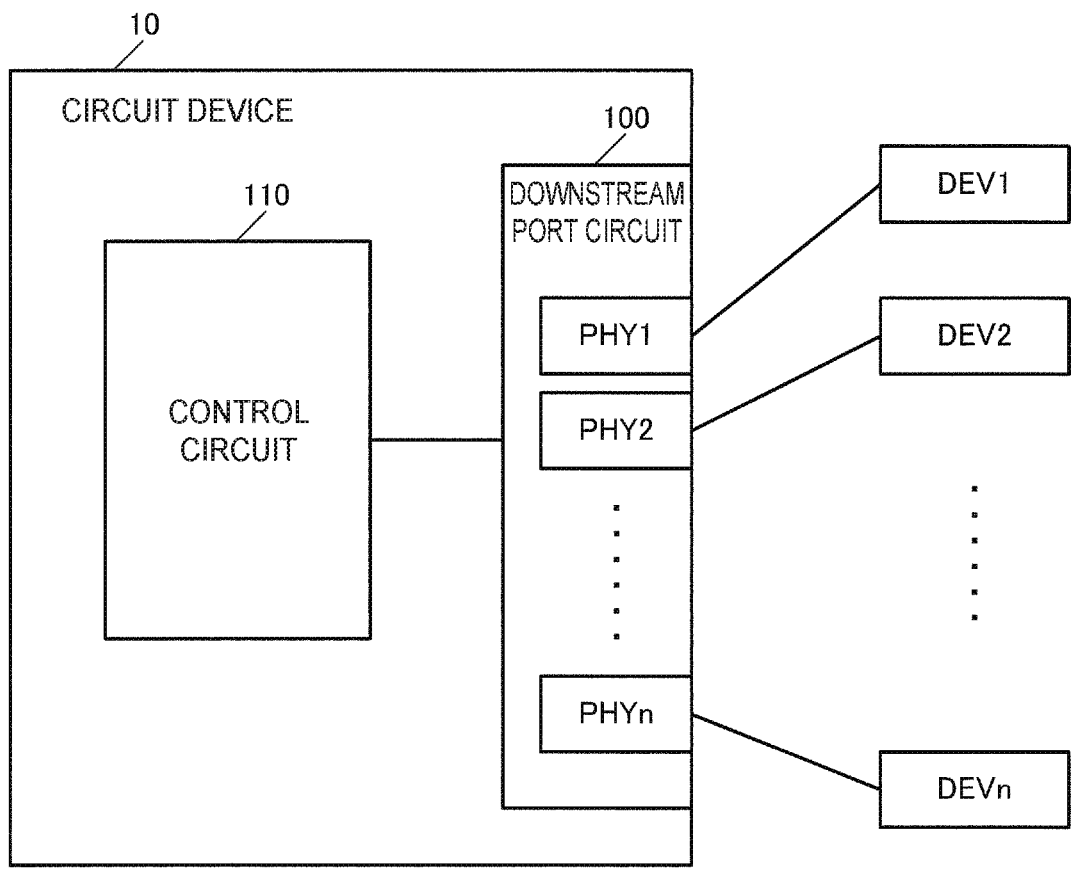
FIG. 2 shows a specific configuration example of a circuit device.

FIG. 2 shows a specific configuration example of the circuit device 10 according to this embodiment. In FIG. 2, the circuit device 10 operates as a USB host controller. Note that the circuit device 10 may be a circuit device of the hub of the USB. In this case, an upstream port circuit may be additionally provided in the circuit device 10.

The circuit device 10 includes a downstream port circuit 100 and a control circuit 110. The control circuit 110 is a circuit that controls the downstream port circuit 100, and the like. The control circuit 110 can be realized by an ASIC (Application Specific Integrated Circuit) provided using automatic placement and routing such as a gate array, or a processor such as an MPU or a CPU. The control circuit 110 executes signal processing and various types of control processing for operating as a host controller or a hub of the USB. For example, if the circuit device 10 is a host controller, the control circuit 110 performs host processing that complies with EHCI (Enhanced Host Controller Interface), XHCI (Extensible Host Controller Interface), OHCI (Open Host Controller Interface), UHCI (Universal Host Controller Interface), or the like. Note that host processing that complies with a standard unique to a vendor may also be performed. Also, if the circuit device 10 is a circuit device that operates as the hub of the USB, transaction conversion processing, hub-repeat logic processing, and the like are performed.

The downstream port circuit 100 includes physical layer circuits PHY1, PHY2 . . . PHYn that are port circuits for downstream. The physical layer circuits PHY1, PHY2 . . . PHYn are respectively connected to devices DEV1, DEV2 . . . DEVn via the USB. The HS driver 20, the disconnection detection circuit 30, the FS driver 90, and the like in FIG. 1 are provided in (each of) these physical layer circuits PHY1 to PHYn. Note that the physical layer circuits PHY1 to PHYn may also include an HS receiver that is an HS-mode receiving circuit, an FS receiver that is an FS-mode receiving circuit, a single-ended receiver that is a single-ended receiving circuit, and the like, in addition to the HS driver 20, the disconnection detection circuit 30, and the FS driver 90. Also, the downstream port circuit 100 performs serial-to-parallel conversion processing for converting serial data received via the USB into parallel data, parallel-to-serial conversion processing for converting parallel data into serial data, link layer processing such as NRZI processing.

Figure 3:
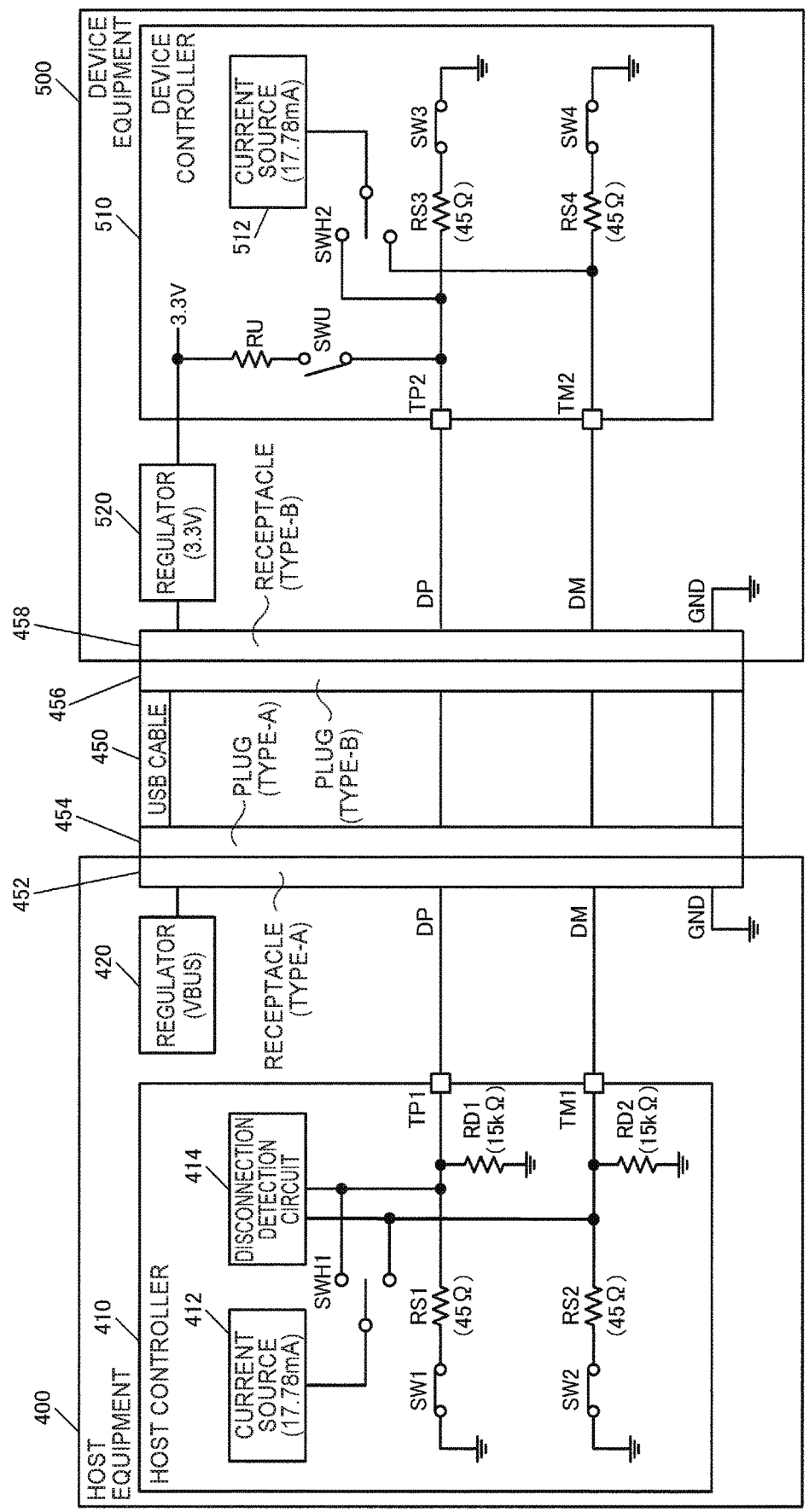
FIG. 3 shows an exemplary connection configuration of a host and a device.

Next, a problem with disconnection detection of the USB will be described in detail. FIG. 3 shows a configuration example when a device is connected in a USB device. Signal lines for DP and DM of a host 400 are routed from the terminal resistors RS1 and RS2 of 45Ω provided in a host controller 410, to terminals for DP and DM of a type-A receptacle 452 via a terminal TP1 for DP and a terminal TM1 for DM, respectively. Note that a switch SW1 provided between one end of the terminal resistor RS1 and the GND node and a switch SW2 provided between one end of the terminal resistor RS2 and the GND node are realized by the FS driver 90 in FIG. 1. In addition, a switch SWH1 for selecting the signal line for DP or the signal line for DM as a signal line to which a drive current from a current source 412 is to be output, and a disconnection detection circuit 414 that performs disconnection detection of the USB are provided in the host controller 410. In addition, a regulator 420 that generates a VBUS voltage is provided in the host 400.

Signal lines for DP and DM of a device 500 are wired from the terminal resistors RS3 and RS4 of 45Ω provided in a device controller 510, to terminals for DP and DM of a Type-B receptacle 458 via a terminal TP2 for DP and a terminal TM2 for DM. In addition, a type-A plug 454 of a USB cable 450 is connected to the host 400, and a type-B plug 456 of the USB cable 450 is connected to the device 500. Note that a switch SW3 provided between one end of the terminal resistor RS3 and a GND node and a switch SW4 provided between one end of the terminal resistor RS4 and a GND node are realized by the FS driver 170 in FIG. 1. In addition, a switch SWH2 for selecting the signal line for DP or the signal line for DM as a signal line to which a drive current from a current source 512 is to be output is provided in the device controller 510. In addition, a regulator 520 that generates a voltage of 3.3 V based on a VBUS voltage is provided in the device 500. Note that, according to this embodiment, the host 400 and the host controller 410 are simply referred to as a "host" as appropriate, and the device 500 and the device controller 510 are simply referred to as a "device", as appropriate.

In the configuration example in FIG. 3, when the interconnect resistance on the circuit substrate and the internal resistance of the USB cable 450 are 0Ω, the amplitudes of HS packets of the signal lines for DP and DM of the USB are as follows.

When the device is connected, a drive current from the current source 412 of the host 400 flows to both the terminal resistors RS1 and RS2 of the host 400 and the terminal resistors RS3 and RS4 of the device 500. Therefore, the amplitude of an HS packet is expressed as ((45Ω×45Ω)/(45Ω+45Ω))×17.78 mA=22.5Ω×17.78 mA=400.05 mV. On the other hand, when the device is disconnected, a drive current from the current source 412 flows to the terminal resistors RS1 and RS2 of the host 400 only, and thus the amplitude of an HS packet is expressed as 45Ω×17.78 mA=800.1 mV.

The disconnection detection circuit 414 that performs disconnection detection of the device 500 during HS communication is provided in the host controller 410. A disconnection detection level VDIS based on which this disconnection detection circuit 414 performs determination on disconnection is stipulated in the USB standard as 525 mV<VDIS<625 mV. Therefore, it is possible to perform disconnection detection of the device 500 by setting a determination voltage for the disconnection detection circuit 414 performing disconnection detection to be within the range of 525 to 625 mV that is the range of the disconnection detection level VDIS. Accordingly, if the device 500 is connected, the amplitude of EOP (End of Packet) of SOF (Start of Frame) packets is 400 mV, for example, and thus the disconnection detection circuit 414 determines that device disconnection has not been detected. On the other hand, when the device 500 is disconnected, the amplitude of EOP is 800 mV, for example, and thus the disconnection detection circuit 414 determines that device disconnection has been detected. Note that, in this embodiment, an SOF packet is referred to as "SOF" as appropriate.

Figure 4:
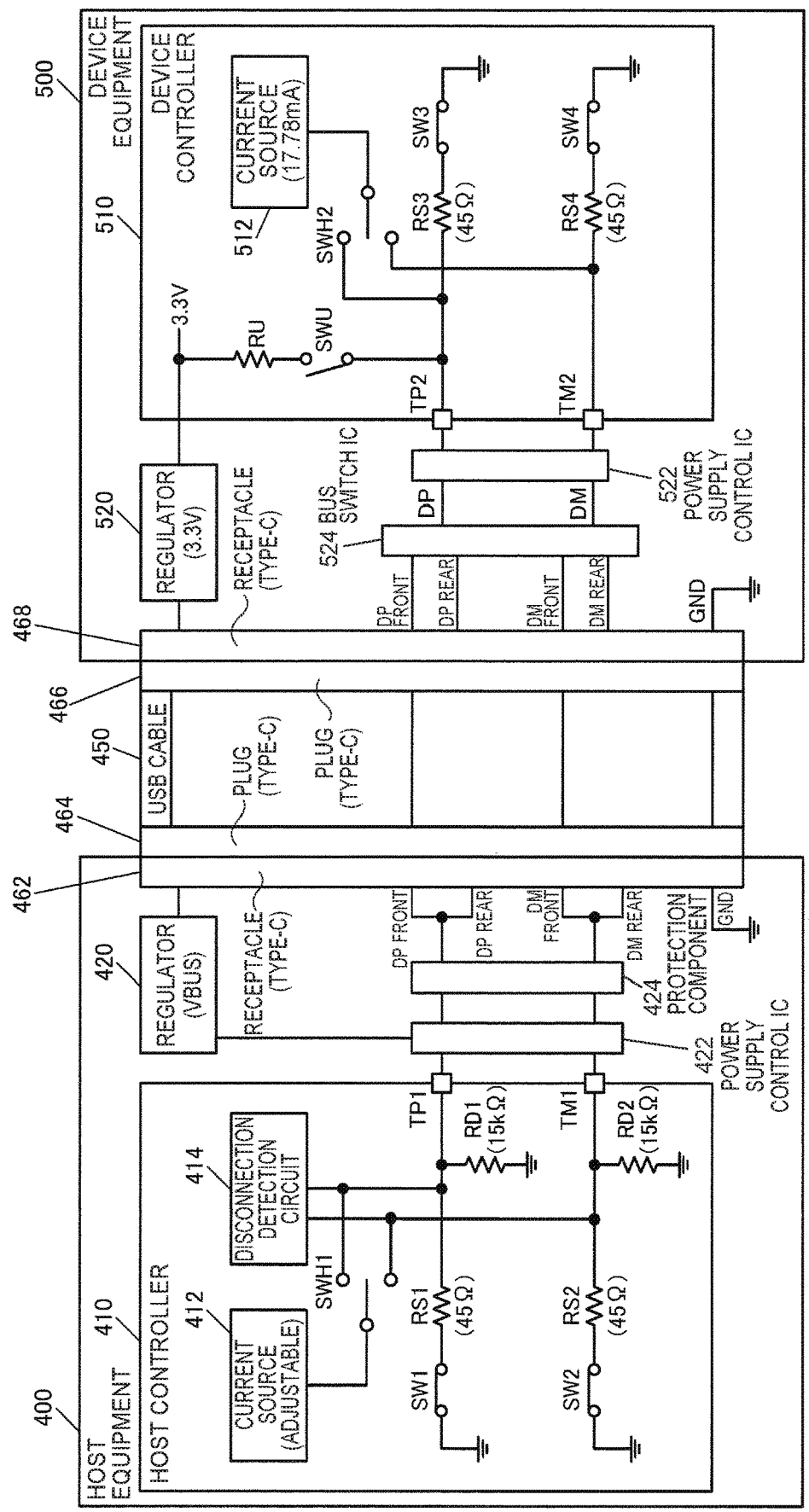
FIG. 4 shows an exemplary connection configuration of a host and a device.

On the other hand, in recent years, it has been able to provide various components on the circuit substrate of the USB device. FIG. 4 shows a configuration example of such a USB device when a device is connected. The signal line for DP of the host 400 is routed from the terminal resistor RS1 to a front terminal for DP and a rear terminal for DP of a type-C receptacle 462 via the terminal TP1 for DP, a power supply control IC 422, and a protection component 424. The signal line for DM of the host 400 is routed from the terminal resistor RS2 to a front terminal for DM and a rear terminal for DM of the receptacle 462 via the terminal TM1 for DM, the power supply control IC 422, the protection component 424.

A power supply control IC that complies with the Battery Charging (BC) Specification of USB is used as the power supply control IC 422 of the host 400, and agreement on supply power between the host and the device is made using a unique protocol before USB connection is performed. A component that aims for electrostatic protection, power fault protection, ground fault protection, or the like is used as the protection component 424 of the host 400.

The signal line for DP of the device 500 is routed from the terminal resistor RS3 to a front terminal for DP and a rear terminal for DP of a type-C receptacle 468 via the terminal TP2 for DP, a power supply control IC 522, and a bus switch IC 524. The signal line for DM of the device 500 is routed from the terminal resistor RS4 to a front terminal for DM and a rear terminal for DM of the receptacle 468 via the terminal TM2 for DM, the power supply control IC 522, and the bus switch IC 524.

Similarly to the power supply control IC 422 of the host 400, the power supply control IC 522 of the device 500 is used for making an agreement on supply power. The bus switch IC 524 of the device 500 is used for selecting the front terminals (front terminal for DP/front terminal for DM) or the rear terminals (rear terminal for DP/rear terminal for DM) of the receptacle 468. Also, a type-C plug 464 of the USB cable 450 is connected to the host 400, and a type-C plug 466 of the USB cable 450 is connected to the device 500.

In the configuration example in FIG. 4, various components are added to the signal lines for DP and DM between the host and the device compared to the configuration example in FIG. 3, and thus the internal resistances of these components in addition to the terminal resistors RS1 and RS2, RS3, and RS4 need to be taken into consideration.

Assuming that, in the configuration example in FIG. 4, the internal resistance of each of the components mounted in the host 400 and the device 500 is 20Ω, the amplitudes of an HS packet of signal lines for DP and DM of the USB are as follows.

Accordingly, when the device is connected, a drive current flows to the terminal resistors RS1 and RS2 of the host 400 and the terminal resistors RS3 and RS4 of the device 500 and for the internal resistances of the components. Therefore, the amplitude of an HS packet is expressed as ((45Ω×(45Ω+20Ω+20Ω))/(45Ω+(45Ω+20Ω+20Ω)))×17.78 mA=29.423Ω×17.78 mA=523.14 mV. On the other hand, when the device is disconnected, a drive current from the current source 412 flows only to the terminal resistors RS1 and RS2 of the host 400, and thus the amplitude of an HS packet is expressed as 45Ω×17.78 mA=800.1 mV.

As described above, the disconnection detection level VDIS based on which the disconnection detection circuit 414 performs determination on disconnection is stipulated as 525 mV<VDIS<625 mV. Therefore, in the configuration example in FIG. 4, if a determination voltage for the disconnection detection circuit 414 performing disconnection detection is set to be in the vicinity of 525 mV that is a lower limit value of the disconnection detection level, the amplitude of EOP of SOF reaches 523.14 mV as described above when the device is connected, and thus there is the possibility that, when the device is connected, a false detection for disconnection will be made. Furthermore, if the host controller 410 has increased the drive current higher than 17.78 mA in order to compensate for attenuation of the signal level caused by the USB cable 450, the amplitude of EOP increases further, and thus the probability of a false detection for disconnection being made increases.

In order to prevent such a false detection for disconnection, it is conceivable that a determination voltage for disconnection detection is set to be in the vicinity of 625 mV, which is an upper limit value of the disconnection detection level, but, in this case, adversely, there is a risk that, when the device is disconnected, disconnection detection cannot be performed under the influence of reflection waves that depend on the cable length of the USB cable 450. FIGS. 5 to 8 are diagrams illustrating the influence of reflection waves that depend on the cable length. Device disconnection here refers to a state where the plug 456 of the USB cable 450 is removed from the receptacle 458 of the device 500 in the configuration example in FIG. 3. At this time, the USB cable 450 is connected to the host 400.

Figure 5:
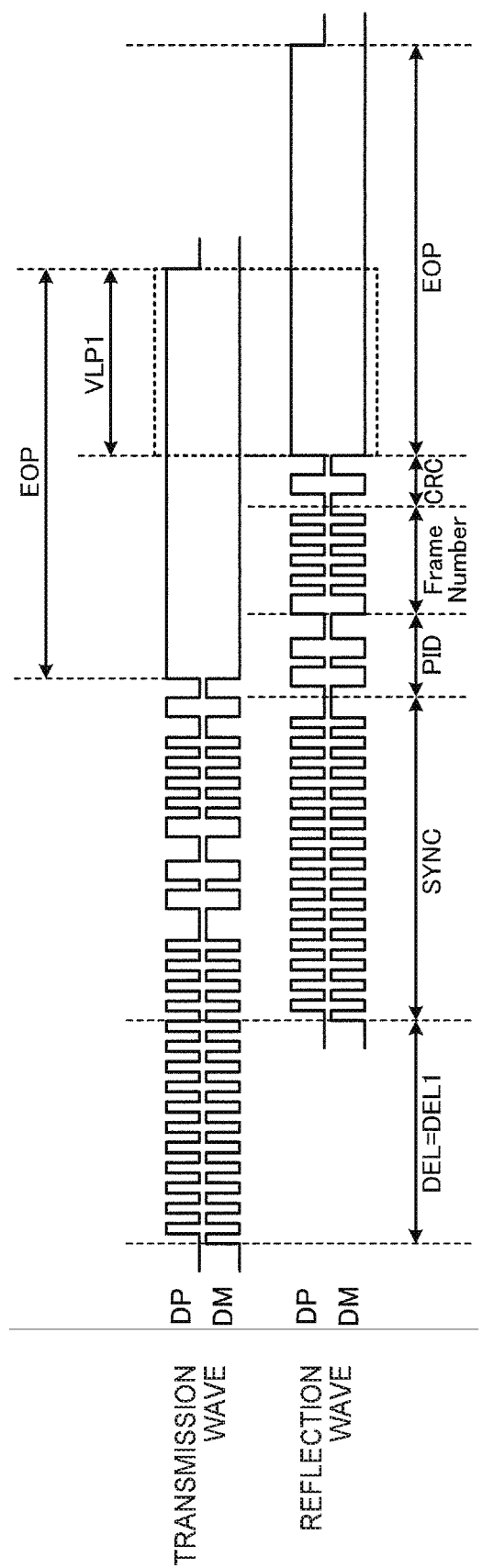
FIG. 5 is a diagram illustrating a problem that occurs due to reflection waves being superimposed on transmission waves.
Figure 6:
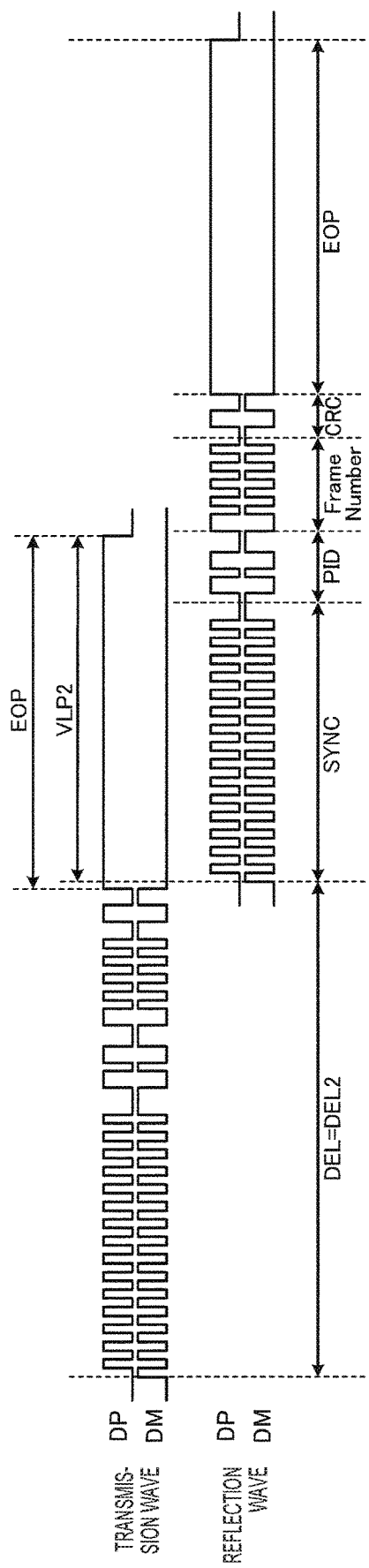
FIG. 6 is a diagram illustrating a problem that occurs due to reflection waves being superimposed on transmission waves.

When HS termination of 45Ω is lost due to device disconnection, reflection waves are superimposed on EOP of SOF that is detected by the host. FIG. 5 shows a case where the cable length of the USB cable 450 is short, and delay (DEL=DEL1) of reflection waves is small, and FIG. 6 shows a case where the cable length is long, and delay (DEL=DEL2) of reflection waves is large. In FIG. 5, since the cable length is short and the delay DEL is small, EOP of transmission waves of the host and EOP of reflection waves include a temporally superimposed section VLP1. In this the superimposed section VLP1, the signal amplitude of EOP does not decrease, and thus the host can perform device disconnection detection. On the other hand, in FIG. 6, since the cable length is long and the delay DEL is large, EOP of transmission waves of the host and EOP of reflection waves do not include a superimposed section. Moreover, in FIG. 6, EOP of transmission waves of the host is superimposed on SYNC and PID of reflection waves in a superimposed section VLP2. Therefore, there is a risk that the DC signal amplitude of EOP does not increase in the superimposed section VLP2, and the host cannot perform device disconnection detection.

Figure 7:
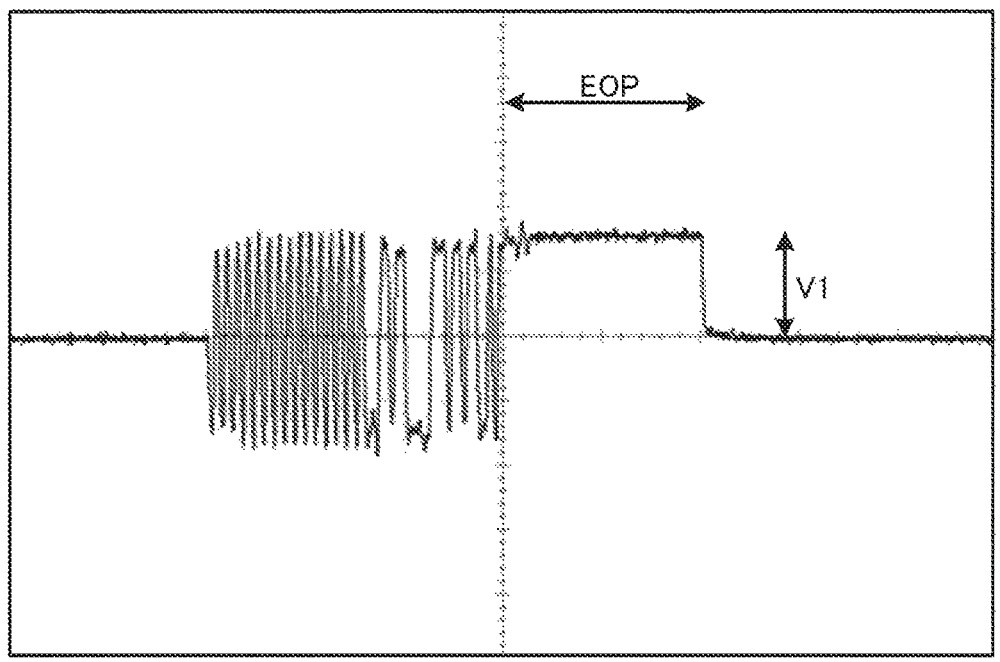
FIG. 7 shows a SOF waveform when a device is not disconnected.

FIG. 7 shows an example of an SOF waveform when device disconnection has not been performed. In FIG. 7, device disconnection has not been performed, and impedance match is achieved due to 45Ω HS termination of the device, and thus no reflection waves are generated. Also, due to HS termination, a signal amplitude V1 of EOP of transmission waves of SOF of the host is about 400 mV, for example.

Figure 8:
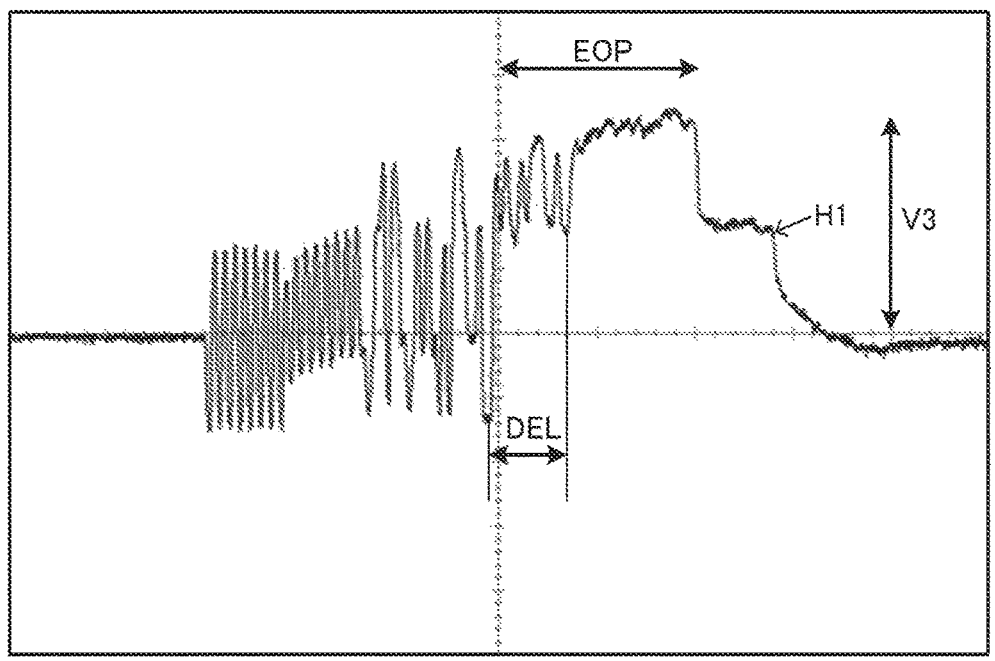
FIG. 8 shows a SOF waveform example when a device is disconnected and a cable length is short.

FIG. 8 shows an example of an SOF waveform when the device has been disconnected, and the cable length of the USB cable 450 is relatively short. In FIG. 8, reflection waves denoted by H1 are superimposed on EOP of transmission waves due to impedance mismatch. In FIG. 8, as in FIG. 5 described above, EOP of transmission waves and EOP of reflection waves are superimposed on each other in a superimposed section VLP1. In addition, a signal amplitude V3 of EOP of transmission waves exceeds the disconnection detection level, and thus the host can detect device disconnection.

Figure 9:
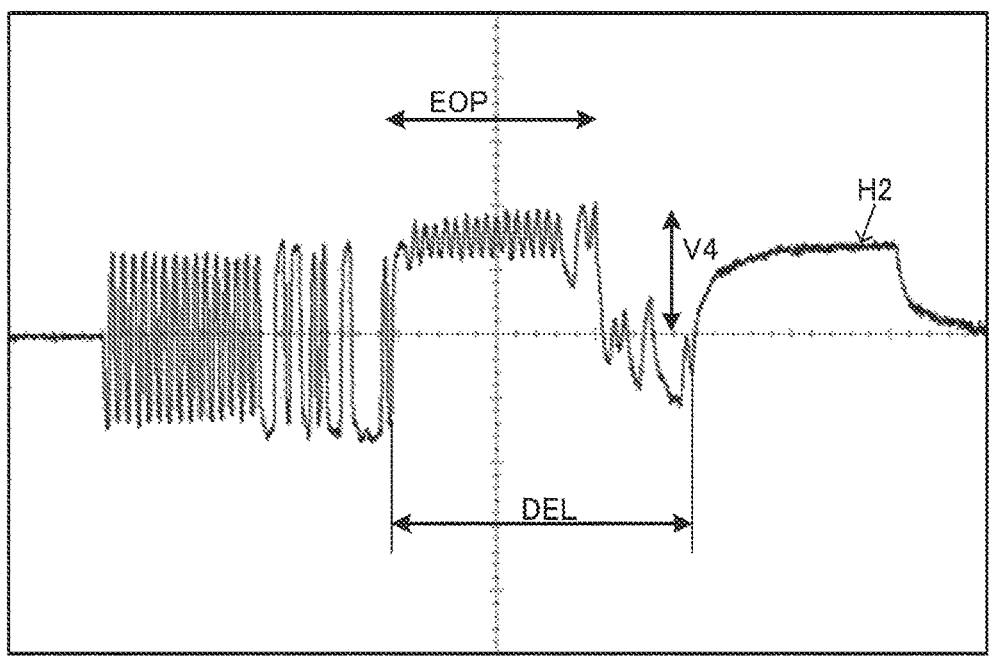
FIG. 9 shows a SOF waveform example when a device is disconnected and a cable length long.

On the other hand, FIG. 9 shows an example of an SOF waveform when the device has been disconnected, and the cable length of the USB cable 450 is long. In FIG. 9, reflection waves denoted by H2 are superimposed on transmission waves due to impedance mismatch. In FIG. 9, as in FIG. 6 described above, EOP of transmission waves is superimposed on SYNC and PID of reflection waves in a superimposed section VLP2. Accordingly, a signal amplitude V4 of EOP of transmission waves has decreased, and it is not possible to maintain 800 mV that is a basic amplitude when the device is disconnected, and the amplitude approaches 625 mV, which is the upper limit value of the disconnection detection level. Therefore, if the determination voltage for the disconnection detection circuit 414 performing disconnection detection is set to be in the vicinity of 625 mV, which is the upper limit value of the disconnection detection level, there is a risk that the host cannot perform device disconnection detection.

As described above, in the USB device, an optimum determination voltage at the disconnection detection level changes according to conditions such as the internal resistances of the components mounted in the host 400 and the device 500 as well as the length of the USB cable 450 used for connection. On the other hand, since the USB standard is a general-purpose communication standard, the device 500 is connected to the host 400 under various conditions, and a problem occurs in that, depending on a connection condition, device disconnection is mistakenly detected when the device 500 is connected, and device disconnection cannot be detected when the device 500 is disconnected, for example.

In order to solve the above-described problem, the circuit device 10 according to this embodiment shown in FIG. 1 includes the HS driver 20 and the disconnection detection circuit 30, and the disconnection detection circuit 30 includes the holding circuit 40, the determination voltage generation circuit 60, and the detection circuit 80. In addition, when the HS driver 20 is transmitting a host chirp, the holding circuit 40 holds the first voltage level information, which is voltage level information of one signal out of the DP signal and the DM signal of the USB. In other words, the holding circuit 40 holds the first voltage level information of one signal out of the DP signal and the DM signal during a host chirp, which will be described later with reference to FIG. 10. The determination voltage generation circuit 60 then generates a determination voltage based on the first voltage level information held in the holding circuit 40. Specifically, a first determination voltage is generated by performing predetermined computation processing that is based on the first voltage level information of one signal out of the DP signal and the DM signal, and outputs the generated first determination voltage to the detection circuit 80. The detection circuit 80 then performs disconnection detection of the USB based on this first determination voltage, and outputs a disconnection detection signal. With such a configuration, the voltage level information of the DP signal or the DM signal during a host chirp before HS communication is held in the holding circuit 40, and disconnection detection of the USB during HS communication is performed using a determination voltage generated based on the held voltage level information. Therefore, as described with reference to FIGS. 3 to 9, even if a connection condition such as the internal resistance of a component mounted in the host 400 or the device 500 or the length of the USB cable 450 changes, it is possible to generate an optimum determination voltage that is based on the connection condition at that time, and to perform disconnection detection of the USB. Therefore, it is possible to set an optimum determination voltage for disconnection detection that is based on a connection condition, and to prevent problems of mistakenly detecting device disconnection, not being able to appropriately perform device disconnection detection, and the like from occurring.

2. Determination Voltage for Disconnection Detection

Next, setting of a determination voltage for disconnection detection will be described in detail. First, operations of the host and the device after being connected will be described with reference to the timing waveform chart in FIG. 10.

After cable attachment in which the host and the device are connected, before USB connection is performed, power supply control ICs of the host and the device make an agreement on supply of power from the host to the device using a BC protocol that is a unique protocol (timing t1).

In order to perform notification of the connection to the host, the device sets the signal line for DP of the USB to 3.3 V (FS_J) by switching on the pull-up resistor of 1.5 kΩ, and an FS idle state is entered (timing t2). The host determines that the device is connected, by detecting this state.

When starting communication with the connected device, the host sets the signal lines for DP and DM of the USB to 0 V (SE0) by switching on terminal resistor, and starts bus reset (timing t3). The device determines that the host recognized the connection to the device, by detecting this state.

In order to notify the host that the device supports HS mode, the device sets the signal line for DM to 800 mV by connecting the current source to the signal line for DM, and transmits a device chirp K (timing t4). The host determines that the connected device supports HS mode, by detecting this state.

When starting HS connection with the device, the host alternately sets the signal lines for DP and DM to 800 mV by alternately connecting the current source to the signal line for DP and the signal line for DM, and transmits a host chirp K/J (FS) (timing t6). The device determines that the host has recognized the device supports HS mode, by detecting this state.

In order to notify the host that HS communication is possible, the device switches on the terminal resistor, thereby setting the voltage level of signal lines for DP and DM on the high potential side to 400 mV, and presenting the host chirp K/J (HS) (timing t7). The host determines that the connected device is capable of HS communication, by detecting this state.

When starting HS communication with the device, the host changes the signal lines for DP and DM to 0 V (SE0) by stopping the host chirp K/J (HS), and ends bus reset (timing t8). Subsequently, the host executes HS communication with the device by transmitting various HS packets that include SOF, to the device.

Next, with a focus on a host chirp K/J portion in the timing waveform in FIG. 10, current routes in respective states will be described with reference to FIGS. 11 to 14. Note that the values of the pull-down resistance of the host and the pull-up resistance of the device are larger than those of the terminal resistances, which slightly affects the chirp waveform, and is not included in the description of the current routes in respective states. In addition, in FIGS. 11 to 14, RP1 and RP2 indicate internal resistances of components provided on the USB routes. In addition, according to this embodiment, host chirps at timings t6 and t7 in FIG. 10, which are FS-mode host chirps, are referred to as a "host chirp K (FS)", a "host chirp J (FS)", and a "host chirp K/J (FS)", for example. Also, host chirp at the timings t7 and t8, which are HS-mode host chirps, are referred to as a "host chirp K (HS)", a "host chirp J (HS)", and a "host chirp K/J (HS)", for example. This is because it is confirmed, at the timing t7, that both the host and the device support HS mode, and the transfer mode of the USB is switched from the FS mode to the HS mode.

Figure 11:
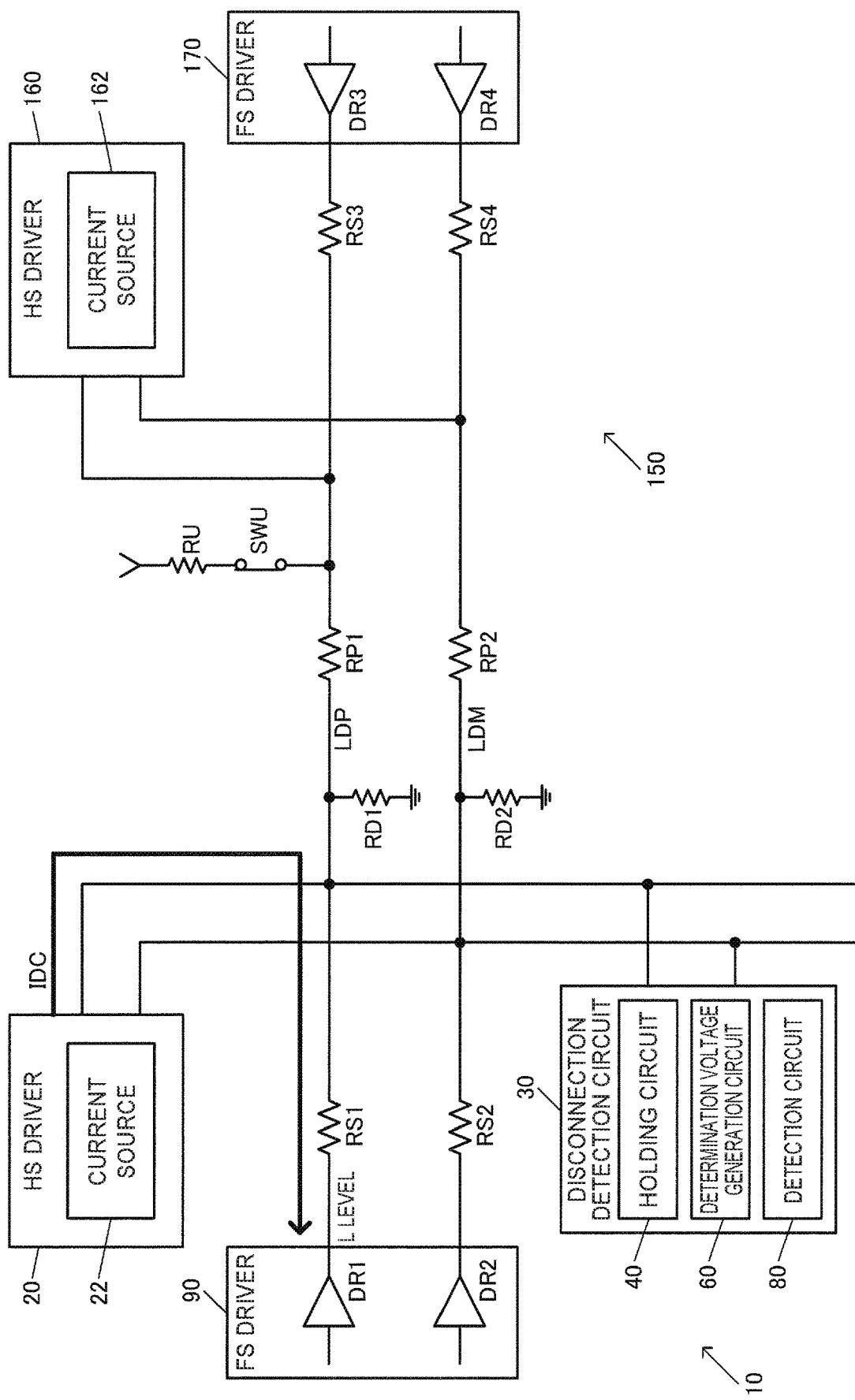
FIG. 11 is a diagram illustrating a current route of an FS-mode host chirp J.

FIG. 11 shows a current route in the state of the host chirp J (FS) with which the signal line for DP of the USB is set to 800 mV. In this state, the host switches on the terminal resistors RS1 and RS2, the terminal resistors RS3 and RS4

(in the FS mode) of the device are off, and the current source 22 of the host is connected on the DP side. Therefore, as shown in FIG. 11, in the current route, a drive current IDC of a constant current from the current source 22 flows only to the terminal resistor RS1 on the DP side of the host. Here, a route that passes through power supply control ICs and components such as a protection component that are mounted in the host and the device is not included in the current route in FIG. 11, and thus the internal resistances of these components do not affect the amplitude of the host chirp J (FS). Note that the host switching on the terminal resistor RS1 or RS2 is the FS driver 90 of the host switching one end of the terminal resistor RS1 or RS2 to an L level. The device switching on the terminal resistor RS3 or RS4 is the FS driver 170 of the device switching one end of the terminal resistor RS3 or RS4 to the L level.

Figure 12:
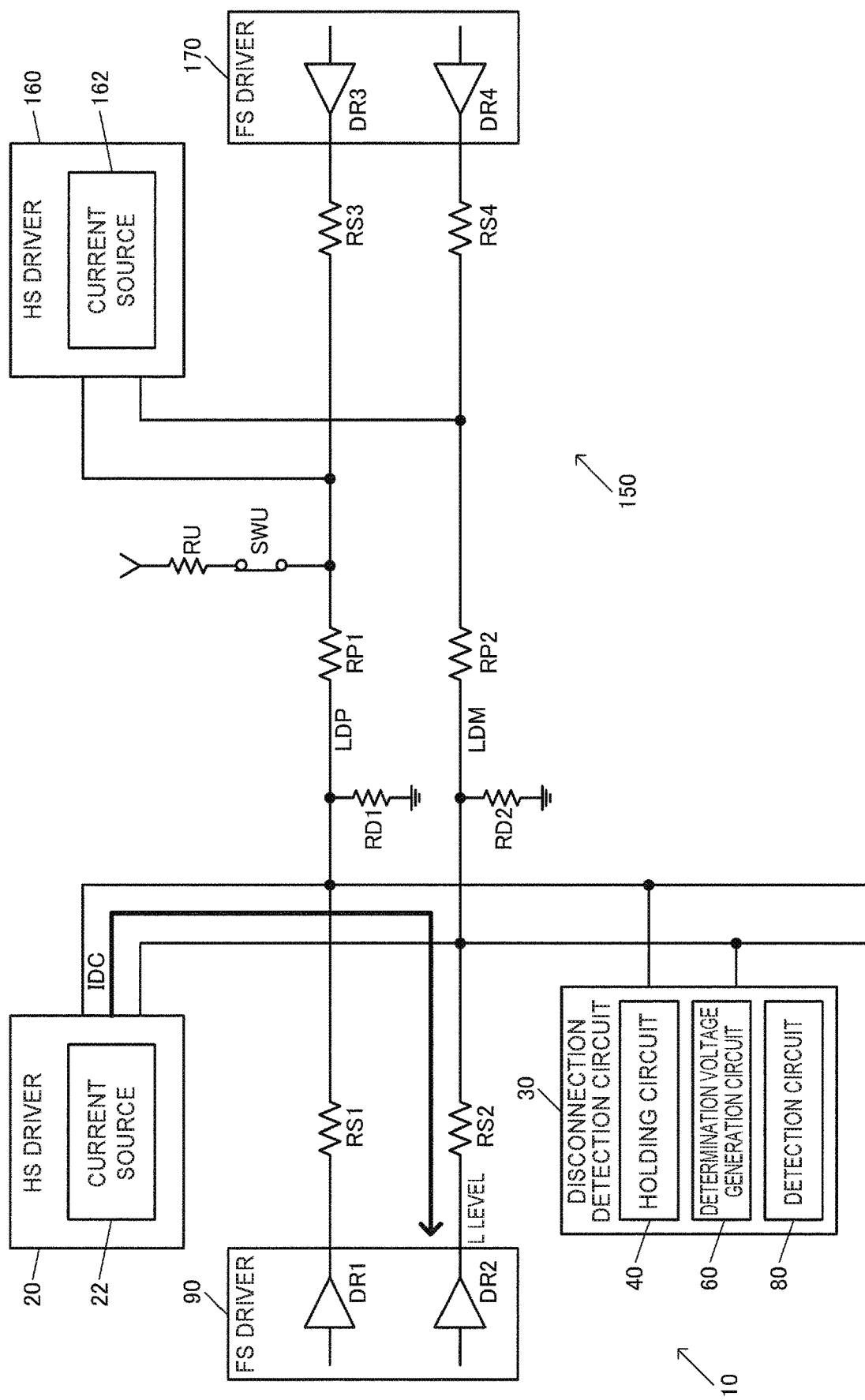
FIG. 12 is a diagram illustrating a current route of an FS-mode host chirp K.

FIG. 12 shows a current route in the state of the host chirp K (FS) with which the signal line for DM of the USB is set to 800 mV. In this state, the host switches on the terminal resistors RS1 and RS2, the terminal resistors RS3 and RS4 of the device (FS mode) are off, and the current source 22 of the host is connected on the DM side. Therefore, as shown in FIG. 12, in the current route, the drive current IDC flows only to the terminal resistor RS2 on the DM side of the host. Here, a route that passes through the power supply control ICs and components such as a protection component that are mounted in the host and the device is not included in the current route in FIG. 12, and thus the internal resistances of these components do not affect the amplitude of the host chirp K (FS).

Figure 13:
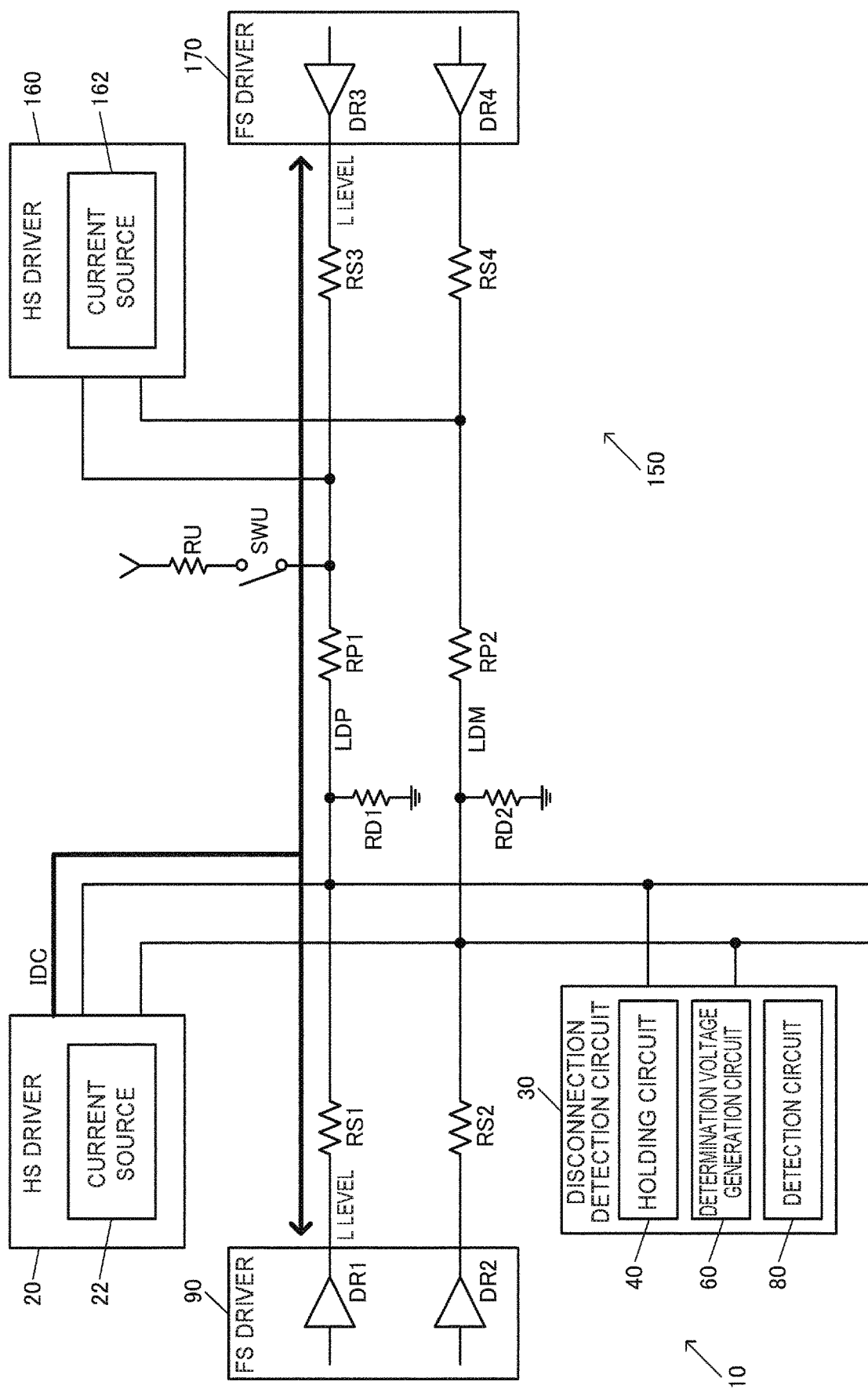
FIG. 13 is a diagram illustrating a current route of an HS-mode host chirp J.

FIG. 13 shows a current route in the state of the host chirp J (HS) with which the signal line for DP of the USB is set to 400 mV. In this state, the host switches on the terminal resistors RS1 and RS2, the device (HS mode) switches on the terminal resistors RS3 and RS4, and the current source 22 of the host is connected on the DP side. Therefore, in the current route, the drive current IDC flows to the terminal resistors RS1 and RS3 on the DP side of the host and device. Here, a route that passes through the power supply control ICs and components such as a protection component that are mounted in the host and the device is included in the current route in FIG. 13, and thus the internal resistances of these components affect a direction in which the amplitude of the host chirp J (HS) is increased.

Figure 14:
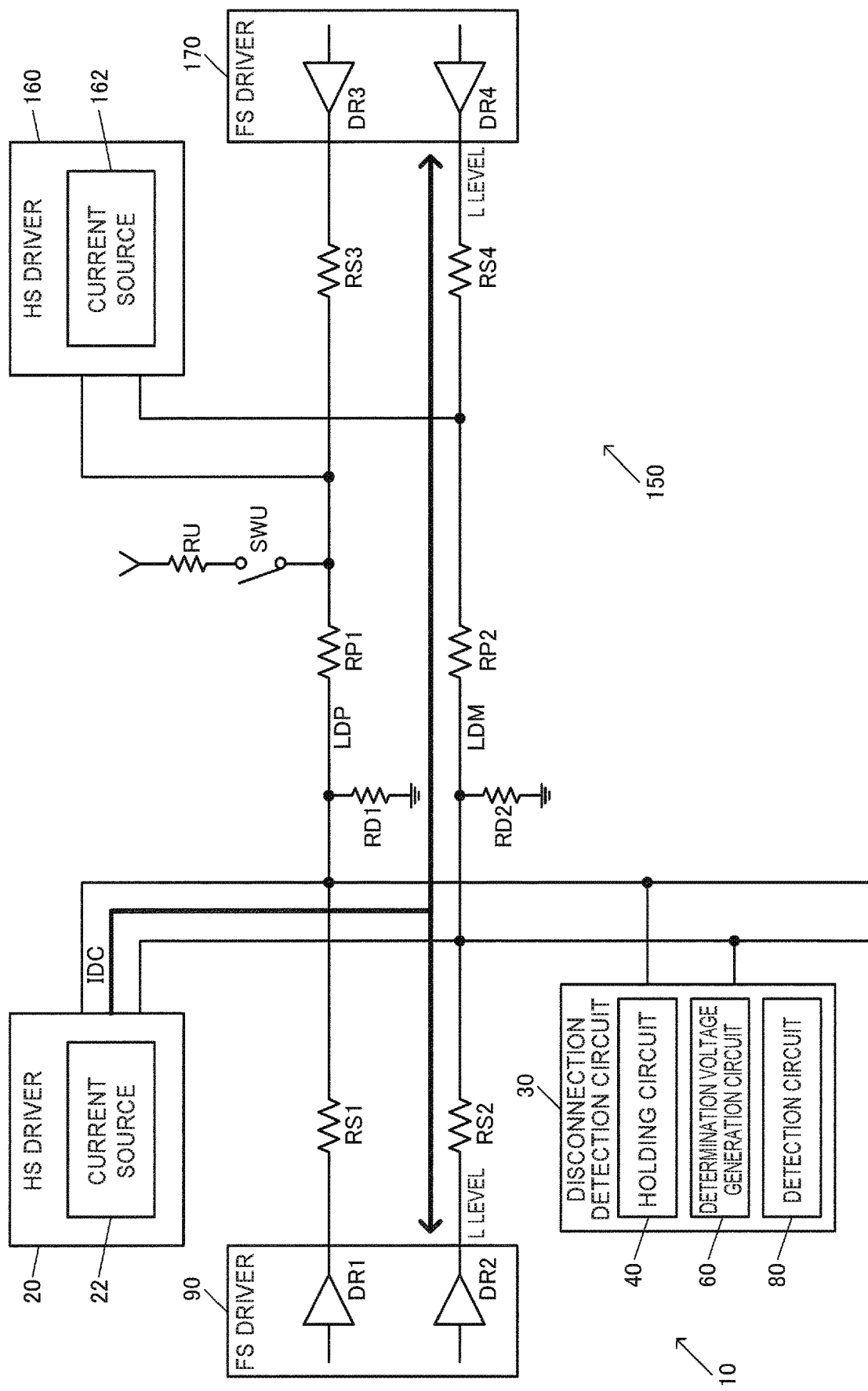
FIG. 14 is a diagram illustrating a current route of an HS-mode host chirp K.

FIG. 14 shows a current route in the state of the host chirp K (HS) with which the signal line for DM of the USB is set to 400 mV. In this state, the host switches on the terminal resistors RS1 and RS2, the device (HS mode) switches on the terminal resistors RS3 and RS4, and the current source 22 of the host is connected on the DM side. Therefore, in the current route, the drive current IDC flows to the terminal resistors RS2 and RS4 on the DM side of the host and device. Here, a route that passes through the power supply control ICs and components such as a protection component that are mounted in the host and the device is included in the current route in FIG. 14, and thus the internal resistances of these components affect a direction in which the amplitude of the host chirp K (HS) is increased.

Comparing the current routes in the respective host chirp states described above with reference to FIGS. 11 to 14 with each other, the difference between the host chirp K/J (FS) state and the host chirp K/J (HS) state is the difference in whether or not the terminal resistors RS3 and RS4 of the device are switched off or on. In addition, similarly, before and after device disconnection during HS communication, there is the difference in whether or not the host recognizes the terminal resistors RS3 and RS4 of the device, but it can be said that current routes at this time are as follows.

A current route for DP before device disconnection during HS communication corresponds to the current route in the state of the host chirp J (HS) in FIG. 13. A current route for DM before device disconnection during HS communication corresponds to the current route in the state of the host chirp K (HS) in FIG. 14.

On the other hand, a current route for DP after device disconnection during HS communication corresponds to the current route in the state of the host chirp J (FS) in FIG. 11. A current route for DM after device disconnection during HS communication corresponds to the current route in the state of the host chirp K (FS) in FIG. 12.

While the host and the device are connected, the current value of the current source 22 of the host is always constant, in general, and there is no difference between the current value during a period of a host chirp and the current value during HS communication. Also in a host that has a current adjustment function for widening the amplitude, it is possible to statically adjust the current value of the current source 22 before the device is connected, but, when the device is connected, the current value is not dynamically changed. In addition, while the host and the device are connected, the configuration of the USB cable that connects the host and the device is always the same, and cannot be changed. Furthermore, the values of the terminal resistances of the host and device as well as the internal resistances of the power supply control ICs and components such as a protection component that are provided on the signal lines for DP and DM of the USB are also always constant while the host and the device are connected.

In consideration of such situations, the current value and the resistance value, which are conditions of a current route, are the same during the period of a host chirp and during HS communication, and thus the amplitude is also considered to be the same. Here, in consideration of the relationship between current routes, it can be said that the HS packet amplitudes before and after device disconnection are as follows.

Figure 10:
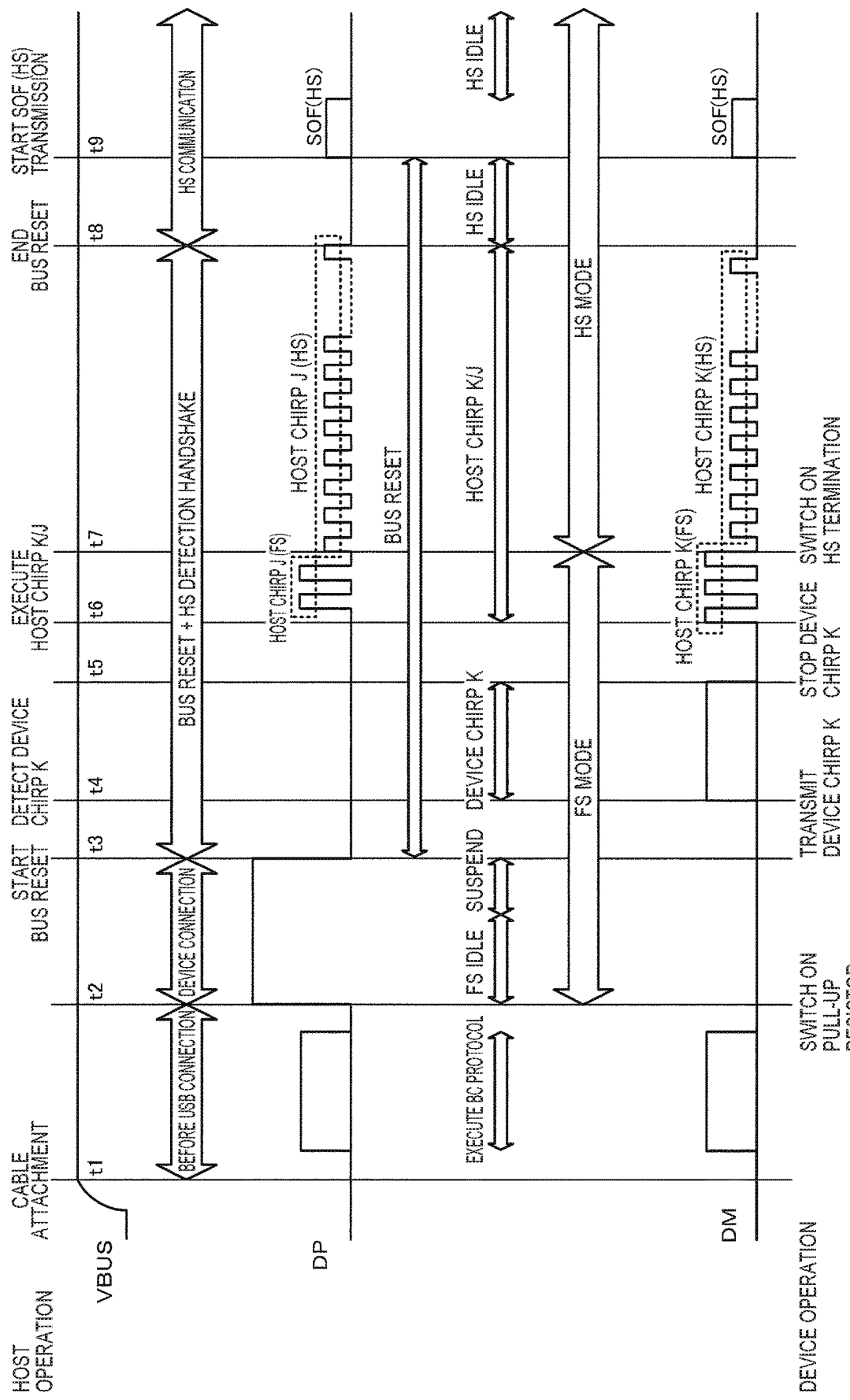
FIG. 10 is a timing waveform chart after a host and a device are connected.

Accordingly, the HS packet amplitude on the DP side before device disconnection corresponds to the amplitude at timing t7 to t8 in FIG. 10 and the amplitude of the host chirp J (HS) shown in FIG. 13. The HS packet amplitude on the DM side before device disconnection corresponds to the amplitude at timing t7 to t8 in FIG. 10 and the amplitude of the host chirp K (HS) shown in FIG. 14.

On the other hand, the HS packet amplitude on the DP side after device disconnection corresponds to the amplitude at timing t6 to t7 in FIG. 10 and the amplitude of the host chirp J (FS) shown in FIG. 11. The HS packet amplitude on the DM side after device disconnection corresponds to the amplitude at timing t6 to t7 in FIG. 10 and the amplitude of the host chirp K (FS) shown in FIG. 12.

As described above, as a result of measuring the amplitude of each host chirp after the host and the device are connected, it is possible to recognize the amplitudes of the HS packet before and after device disconnection during HS communication. Specifically, as a result of measuring the amplitude of the host chirp at timing t6 to t8 in FIG. 10, it is possible to recognize the amplitudes of the HS packet before and after device disconnection during HS communication at timing t8 onward. It is then possible to infer, from the recognized HS packet amplitudes, a determination voltage at an optimum disconnection detection level under the current connection condition.

In view of this, according to this embodiment, after the host and the device are connected, the holding circuit 40 measures and holds voltage level information of the DP signal or the DM signal for a host chirp at timing t6 to t8 in FIG. 10. The determination voltage generation circuit 60 then generates, based on the held voltage level information, a determination voltage at an optimum disconnection detection level under the current connection condition. The detection circuit 80 performs device disconnection detection of the USB during HS communication at timing t8 onward in FIG. 10, based on the generated determination voltage. With such a configuration, device disconnection detection of USB can be performed using an optimum determination voltage under the current connection condition.

3. Disconnection Detection Circuit

Next, a detailed configuration example of the disconnection detection circuit 30 will be described. Note that a description will be given under the assumption that one signal out of the DP signal and the DM signal is the DP signal, and the other is the DM signal. Note that a configuration may also be adopted in which the one signal is the DM signal, and the other signal is the DP signal.

Figure 15:
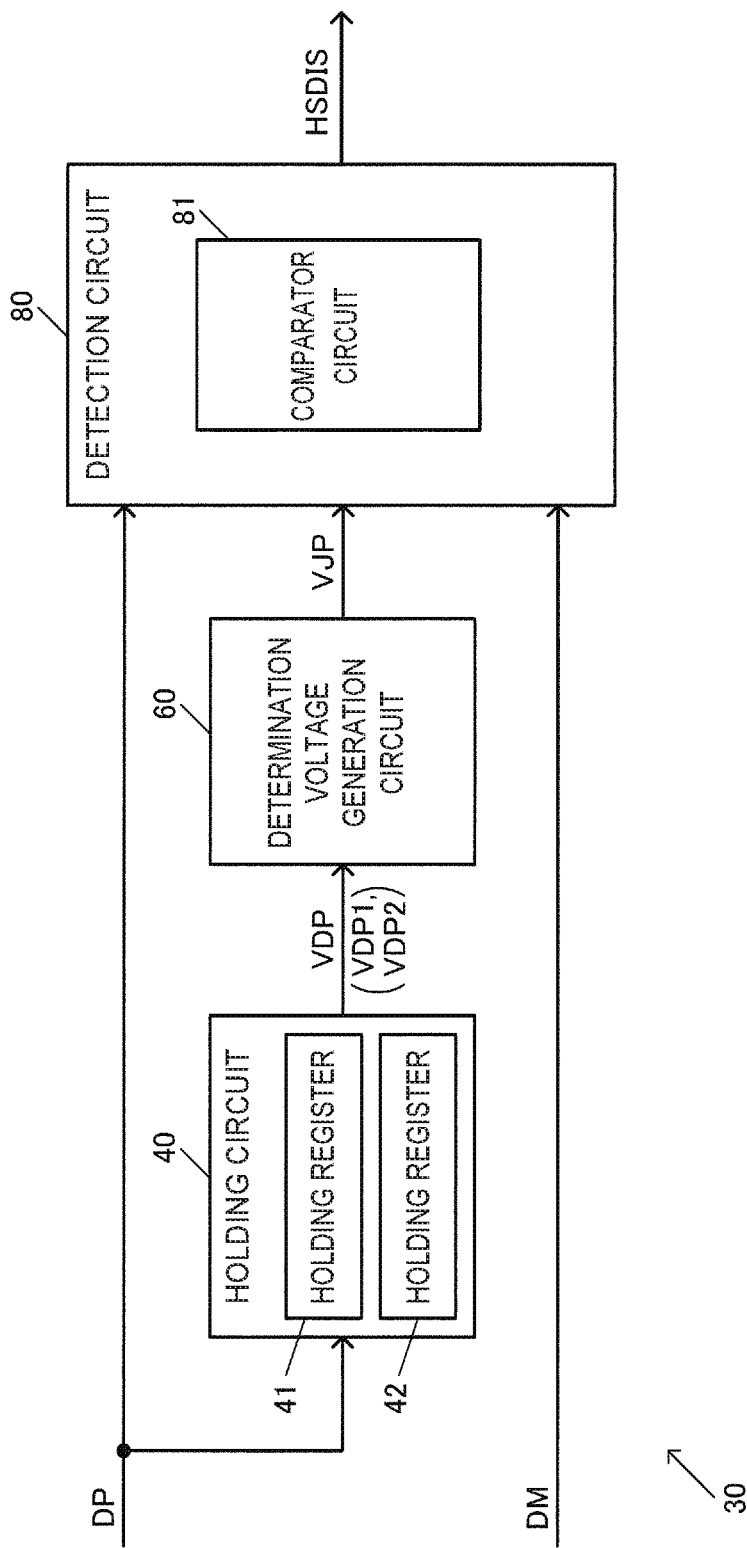
FIG. 15 shows a first configuration example of a disconnection detection circuit.

FIG. 15 shows a first configuration example of the disconnection detection circuit 30. The disconnection detection circuit 30 includes the holding circuit 40, the determination voltage generation circuit 60, and the detection circuit 80. In addition, the detection circuit 80 includes a comparator circuit 81. The comparator circuit 81 compares a determination voltage VJP generated by the determination voltage generation circuit 60 with the voltage of the DP signal that is one signal out of the DP signal and the DM signal. The detection circuit 80 then outputs a disconnection detection signal HSDIS based on the comparison result of the comparator circuit 81. The holding circuit 40 is a first holding circuit, the determination voltage generation circuit 60 is a first determination voltage generation circuit, the determination voltage VJP is a first determination voltage, and the comparator circuit 81 is a first comparator circuit. For example, the holding circuit 40 holds, as a detected value VDP, voltage level information of host chirps in the HS mode and the FS mode at timing t6 to t8 in FIG. 10, for example. The detected value VDP is a digital value indicating the voltage value of the amplitude of a host chirp in the HS mode or the FS mode, for example. The determination voltage generation circuit 60 performs computation for obtaining the determination voltage VJP based on the detected value VDP held in the holding circuit 40, and outputs the obtained determination voltage VJP to the detection circuit 80. The detection circuit 80 then compares the voltage of the DP signal with the determination voltage VJP, for example, and, if, for example, the voltage of the DP signal exceeds the determination voltage VJP, the detection circuit 80 turns the disconnection detection signal HSDIS to an active label, and outputs the disconnection detection signal HSDIS. For example, the disconnection detection signal HSDIS at an H level, which is an active label, is output. In addition, for example, the detection circuit 80 compares the voltage of the DM signal with the determination voltage VJP, and, for example, if the voltage of the DM signal exceeds the determination voltage VJP, the detection circuit 80 can turn the disconnection detection signal HSDIS to an active label, and output the disconnection detection signal HSDIS. If such the comparator circuit 81 is provided, as a result of comparing a determination voltage set in accordance with voltage level information of a host chirp with the voltage of one signal out of the DP signal and the DM signal, it is possible to perform device disconnection detection, and output the disconnection detection signal HSDIS.

In addition, according to this embodiment, the host chirp held by the holding circuit 40 is an HS-mode host chirp, for example. Specifically, when the HS driver 20 is transmitting an HS-mode host chirp at timing t7 to t8 in FIG. 10, the holding circuit 40 holds the voltage level information of the HS-mode host chirp, and the determination voltage generation circuit 60 outputs, to the detection circuit 80, the determination voltage VJP that is based on the held voltage level information.

For example, the holding circuit 40 measures and holds voltage level information of the DP signal for which the HS-mode host chirp J described with reference to FIG. 13 is transmitted. For the HS-mode host chirp J, the voltage level of the DP signal is set to 400 mV, but, if a component is provided on the USB route as in FIG. 4, the voltage level of the DP signal increases higher than 400 mV due to the internal resistance of the component. In addition, the voltage level of the DP signal increases also due to the internal resistance of the USB cable. Also, if the voltage level of the DP signal increases higher than 400 mV due to the internal resistance of a component or the like in this manner, the determination voltage VJP that is generated based on the voltage level information of the DP signal also increases. Therefore, as a result of measuring the voltage level information of an HS-mode host chirp, and generating the determination voltage VJP, it is possible to generate an optimum determination voltage VJP that is based on the internal resistance of the component or the like provided on the USB route, and realize appropriate disconnection detection of USB.

Note that the holding circuit 40 may measure and hold voltage level information of the DM signal for which the HS-mode host chirp K is transmitted, the HS-mode host chirp K having been described with reference to FIG. 14. In this case, the determination voltage generation circuit 60 generates a determination voltage that is based on the voltage level information of the HS-mode host chirp K, and the detection circuit 80 performs disconnection detection of USB, based on the generated determination voltage.

In addition, as shown in FIG. 15, the holding circuit 40 includes a holding register 41. The holding register 41 is a first holding register, and holds, as a detected value VDP1, voltage level information of the DP signal that is one signal when the HS driver 20 is transmitting an HS-mode host chirp as the host chirp. The voltage level information of the DP signal is first voltage level information, and the detected value VDP1 is a first detected value. The determination voltage generation circuit 60 then generates a determination voltage VJP, which is a first determination voltage, based on the detected value VDP1.

With such a configuration, the voltage level information of the DP signal for HS-mode host chirp at timing t7 to t8 in FIG. 10 can be held in the holding register 41 as the detected value VDP1 that is a first detected value. The determination voltage VJP is then generated based on the held detected value VDP1, and disconnection detection of USB is performed. Accordingly, it is possible to measure the voltage level information of the HS-mode host chirp, and generate the determination voltage VJP. Therefore, it is possible to generate an optimum determination voltage VJP that is based on the internal resistance of a component or the like provided on the USB route, and to realize appropriate disconnection detection of USB.

In addition, the holding circuit 40 includes a holding register 42. The holding register 42 is a second holding register, and holds, as a detected value VDP2, voltage level information of the DP signal that is one signal when the HS driver 20 is transmitting an FS-mode host chirp as the host chirp. The voltage level information of the DP signal is first voltage level information, and the detected value VDP2 is a second detected value. The determination voltage generation circuit 60 then generates a determination voltage VJP, which is a first determination voltage, based on the detected value VDP1 held in the holding register 41 for the HS-mode host chirp at timing t7 to t8 in FIG. 10, and the detected value VDP2 held in the holding register 42 for the FS-mode host chirp at timing t6 to t7.

With such a configuration, the voltage level information of the DP signal for the HS-mode host chirp can be held in the holding register 41 as the detected value VDP1, and the voltage level information of the DP signal for the FS-mode host chirp can be held in the holding register 42 as the detected value VDP2. The determination voltage VJP is then generated based on the detected values VDP1 and VDP2 held in the holding registers 41 and 42 respectively, and disconnection detection of USB is ready to be performed. Therefore, it is possible to measure both the voltage level information of the DP signal for the HS-mode host chirp and the voltage level information of the DP signal for the FS-mode host chirp, and generate the determination voltage VJP, and appropriate disconnection detection of USB can be realized.

Accordingly, as described above, the amplitude of the HS-mode host chirp at timing t7 to t8 in FIG. 10 corresponds to the amplitude of HS packets before device disconnection, and the amplitude of the FS-mode host chirp at timing t6 to t7 corresponds to the amplitude of HS packets after device disconnection. Therefore, according to the configuration in FIG. 15, the voltage level information of the HS-mode host chirp corresponding to the amplitude of HS packets before device disconnection can be held in the holding register 41 as a detected value DP1. Also, the voltage level information of the FS-mode host chirp corresponding to the amplitude of HS packets after device disconnection can be held in the holding register 42 as a detected value DP2. Therefore, the determination voltage generation circuit 60 can generate the determination voltage VJP based on the detected value DP1 corresponding to the amplitude of HS packets before device disconnection and the detected value DP2 corresponding to the amplitude of HS packets after device disconnection. As a result, for example, the determination voltage VJP can be set to an intermediate voltage between the voltage of the amplitude of HS packets before device disconnection and the voltage of the amplitude of HS packets after device disconnection, and it is possible to set a more appropriate determination voltage VJP, and execute disconnection detection of USB.

Figure 16:
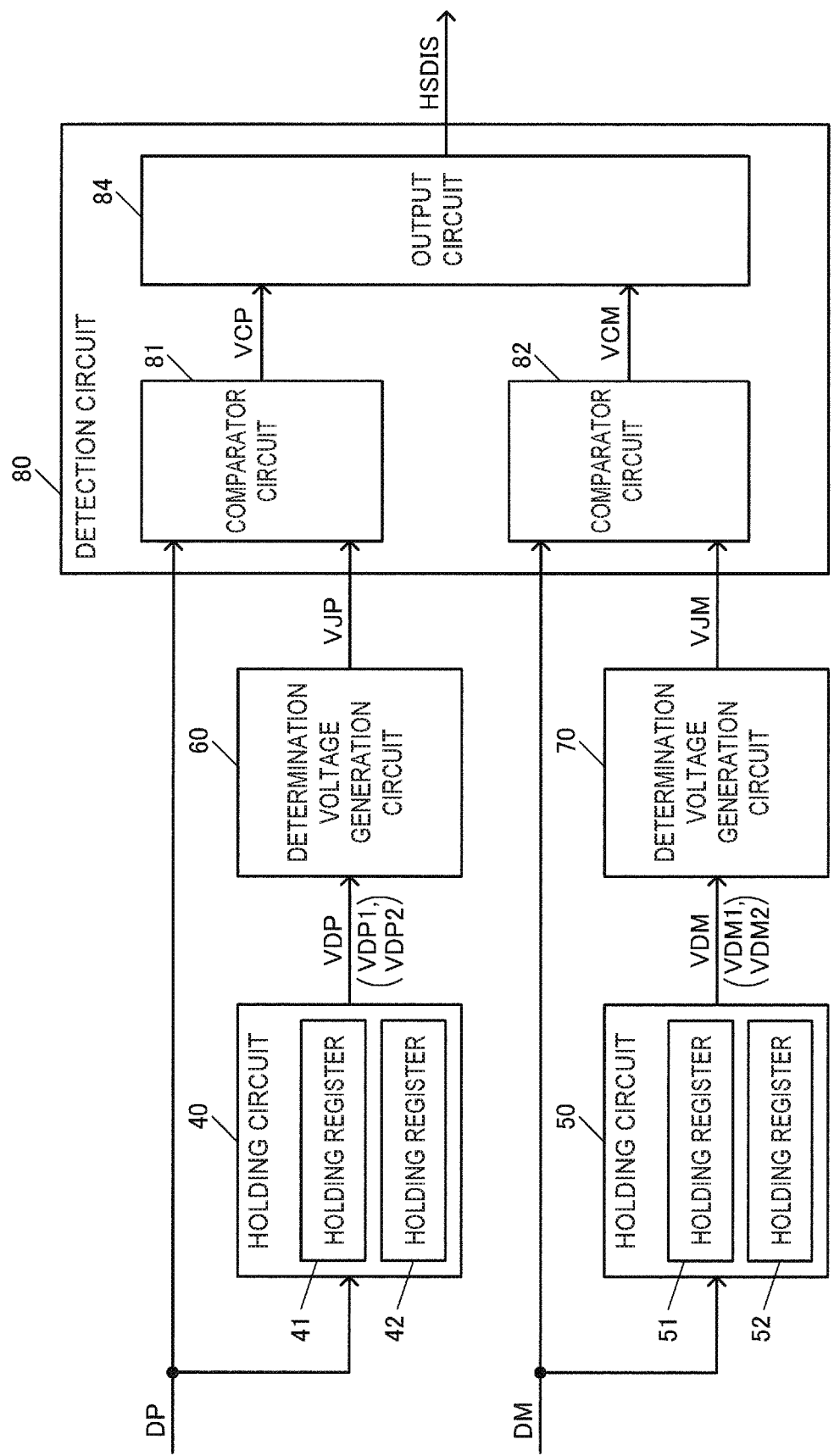
FIG. 16 shows a second configuration example of a disconnection detection circuit.

FIG. 16 shows a second configuration example of the disconnection detection circuit 30. In FIG. 16, the disconnection detection circuit 30 includes a holding circuit 50 and a determination voltage generation circuit 70 in addition to the configuration in FIG. 15. The holding circuit 50 is a second holding circuit, and the determination voltage generation circuit 70 is a second determination voltage generation circuit. The holding circuit 50 measures and holds second voltage level information that is voltage level information of the other signal out of the DP signal and the DM signal when the HS driver 20 is transmitting a host chirp. In FIG. 16, the holding circuit 50 holds voltage level information of the DM signal that is the other signal, as the second voltage level information. The determination voltage generation circuit 70 generates a determination voltage VJM based on the second voltage level information held in the holding circuit 50. The determination voltage VJM is a second determination voltage. The detection circuit 80 then performs disconnection detection of USB based on the determination voltage VJP that is the first determination voltage and the determination voltage VJM that is the second determination voltage, and outputs a disconnection detection signal HSDIS. For example, the detection circuit 80 performs disconnection detection of USB by comparing the voltage of the DP signal with the determination voltage VJP, and comparing the voltage of the DM signal with the determination voltage VJM, and outputs the disconnection detection signal HSDIS.

With such a configuration, disconnection detection of USB can be realized using both the determination voltage VJP that is based on the voltage level information of the DP signal and the determination voltage VJM that is based on the voltage level information of the DM signal. Therefore, it is possible to realize more accurate and appropriate disconnection detection of USB compared with a case where only the voltage level information of one signal out of the DP signal and the DM signal is used.

In addition, in FIG. 16, the detection circuit 80 includes a comparator circuit 81, a comparator circuit 82, and an output circuit 84. The comparator circuit 81 is a first comparator circuit, and the comparator circuit 82 is a second comparator circuit. For example, the comparator circuit 81 compares the voltage of the DP signal that is one signal out of the DP signal and the DM signal, with the determination voltage VJP that is the first determination voltage. A comparison result signal VCP is then output to the output circuit 84. For example, when the voltage of the DP signal exceeds the determination voltage VJP, the comparator circuit 81 turns the comparison result signal VCP to an active label, and outputs the comparison result signal VCP to the output circuit 84. For example, the comparison result signal VCP at the H level is output. The comparator circuit 82 compares the voltage of the DM signal that is the other signal out of the DP signal and the DM signal, with the determination voltage VJM that is the second determination voltage. A comparison result signal VCM is then output to the output circuit 84. For example, when the voltage of the DM signal exceeds the determination voltage VJM, the comparator circuit 82 turns the comparison result signal VCM to an active label, and outputs the comparison result signal VCM to the output circuit 84. For example, the comparison result signal VCM at the H level is output. The output circuit 84 then outputs the disconnection detection signal HSDIS based on the comparison result signals VCP and VCM from the comparator circuits 81 and 82. For example, when one of the comparison result signals VCP and VCM turns to an active label, the output circuit 84 turns the disconnection detection signal HSDIS to an active label, and outputs the disconnection detection signal HSDIS. For example, the disconnection detection signal HSDIS at the H level, which is the active label, is output.

With such a configuration, during HS communication, both the voltage of the DP signal and the voltage of the DM signal are compared with a determination voltage, and disconnection detection of USB is performed, and thus it is possible to realize more reliable disconnection detection of the device. For example, when the voltage of the DP signal exceeds the determination voltage VJP, the comparison result signal VCP is turned to an active label, as a result, the disconnection detection signal HSDIS is turned to an active label, and device disconnection detection is performed. Also when the voltage of the DM signal exceeds the determination voltage VJM, the comparison result signal VCM is turned to an active label, as a result, the disconnection detection signal HSDIS is turned to an active label, and device disconnection detection is performed. Therefore, device disconnection can be more reliably detected compared with a case where only the voltage of one signal out of the DP signal and the DM signal is compared with a determination voltage.

In addition, in FIG. 16, the holding circuit 50 includes a holding register 51. The holding register 51 is a third holding register, and holds, as a detected value VDM1, voltage level information of the DM signal that is the other signal when the HS driver 20 is transmitting an HS-mode host chirp as the host chirp. The detected value VDM1 is a third detected value. The determination voltage generation circuit 70 then generates a determination voltage VJM that is a second determination voltage, based on the detected value VDM1.

With such a configuration, it is possible to measure the voltage level information of the DM signal for the HS-mode host chirp, and generate the determination voltage VJM. Therefore, it is possible to generate an optimum determination voltage VJM that is based on the internal resistance of a component or the like provided on the USB route, and to realize appropriate disconnection detection of USB.

The holding circuit 50 also includes a holding register 52. The holding register 52 is a fourth holding register, and holds, as a detected value VDM2, the voltage level information of the DM signal that is the other signal when the HS driver 20 is transmitting an FS-mode host chirp as the host chirp. The detected value VDM2 is a fourth detected value. The determination voltage generation circuit 70 then generates a determination voltage VJM that is a second determination voltage, based on the detected value VDM1 held in the holding register 51 for the HS-mode host chirp and the detected value VDM2 held in the holding register 52 for the FS-mode host chirp.

With such a configuration, the voltage level information of the DM signal for the HS-mode host chirp can be held in the holding register 51 as the detected value VDM1, and the voltage level information of the DM signal for the FS-mode host chirp can be held in the holding register 52 as the detected value VDM2. The determination voltage VJM is then generated based on the detected value VDM1 held in the holding register 51 and the detected value VDM2 held in and the holding register 52, and disconnection detection of USB is ready to be performed. Therefore, it is possible to measure both the voltage level information of the DM signal for the HS-mode host chirp and the voltage level information of the DM signal for the FS-mode host chirp, and to generate the determination voltage VJM, and appropriate disconnection detection of USB can be realized.

Figure 17:
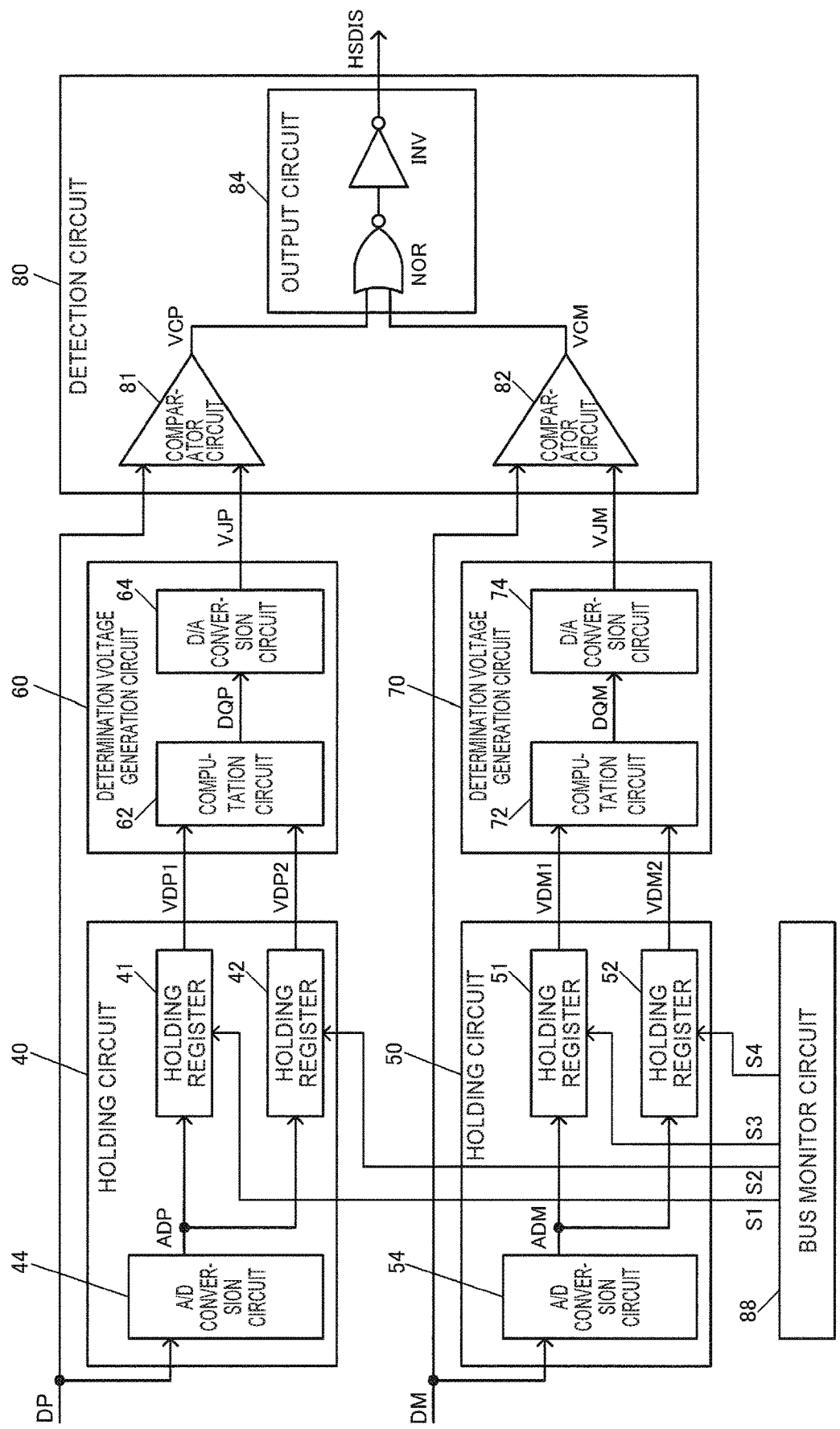
FIG. 17 shows a third configuration example of a disconnection detection circuit.

FIG. 17 shows a third configuration example of the disconnection detection circuit 30. In FIG. 17, the holding circuit 40 includes an A/D conversion circuit 44 and the holding registers 41 and 42. The determination voltage generation circuit 60 includes a computation circuit 62 and a D/A conversion circuit 64. The holding circuit 50 includes an A/D conversion circuit 54 and the holding registers 51 and 52. The determination voltage generation circuit 70 includes a computation circuit 72 and a D/A conversion circuit 74. The detection circuit 80 includes the comparator circuits 81 and 82 and the output circuit 84. In addition, the disconnection detection circuit 30 in FIG. 17 further includes a bus monitor circuit 88.

The A/D conversion circuit 44 measures and A/D converts voltage level information that is the signal amplitude of the DP signal, and outputs an A/D-converted value ADP. The holding register 41 holds, as a detected value VDP1, the A/D-converted value ADP in the period of an HS-mode host chirp. Specifically, the holding register 41 holds, as the detected value VDP1, the A/D-converted value ADP at a timing instructed by a detection signal S1 from the bus monitor circuit 88, in the period of an HS-mode host chirp. The holding register 42 holds, as a detected value VDP2, the A/D-converted value ADP in the period of an FS-mode host chirp. Specifically, the holding register 42 holds, as the detected value VDP2, the A/D-converted value ADP at a timing instructed by a detection signal S2 from the bus monitor circuit 88, in the period of an FS-mode host chirp. The computation circuit 62 performs computation processing that is based on the detected values VDP1 and VDP2, and obtain a computed value DQP for determination on disconnection detection. The D/A conversion circuit 64 generates the determination voltage VJP by D/A-converting the computed value DQP, and outputs the generated determination voltage VJP to the comparator circuit 81.

The A/D conversion circuit 54 measures and A/D converts voltage level information that is the signal amplitude of the DM signal, and outputs an ND-converted value ADM. The holding register 51 holds, as a detected value VDM1, the ND-converted value ADM in the period of an HS-mode host chirp. Specifically, the holding register 51 holds, as the detected value VDM1, the ND-converted value ADM at a timing instructed by the detection signal S3 from the bus monitor circuit 88, in the period of an HS-mode host chirp. The holding register 52 holds, as a detected value VDM2, the A/D-converted value ADM in the period of an FS-mode host chirp. Specifically, the holding register 52 holds, as the detected value VDM2, the A/D-converted value ADM at a timing instructed by a detection signal S4 from the bus monitor circuit 88, in the period of an FS-mode host chirp. The computation circuit 72 performs computation processing that is based on the detected values VDM1 and VDM2, and obtains a computed value DQM for determination on disconnection detection. The D/A conversion circuit 74 generates the determination voltage VJM by D/A-converting the computed value DQM, and outputs the determination voltage VJM to the comparator circuit 82.

The comparator circuit 81 compares the determination voltage VJP with a voltage that reaches the signal amplitude of the DP signal at a timing of EOP of SOF. Then, if the voltage of the DP signal exceeds the determination voltage VJP, the comparator circuit 81 turns a comparison result signal VCP to the H level, and outputs the comparison result signal VCP. The comparator circuit 82 compares the determination voltage VJM with a voltage that reaches the signal amplitude of the DM signal at a timing of EOP of SOF. Then, if the voltage of the DM signal exceeds the determination voltage VJM, the comparator circuit 82 turns a comparison result signal VCM to the H level, and outputs the comparison result signal VCM. The output circuit 84 includes a NOR circuit NOR and an inverter circuit INV. When one of the comparison result signals VCP and VCM is turned to the H level that is an active label, the disconnection detection signal HSDIS is turned to the H level, and is output.

The bus monitor circuit 88 monitors the USB signal state. For example, an operation of monitoring the USB bus state is realized by monitoring the voltage level and the like of the signal lines for DP and DM. The detection signals S1, S2, S3, and S4 are then output to the holding circuits 40 and 50 based on the monitoring result. The holding circuit 40 holds the detected values VDP1 and VDP2 that are the first voltage level information of the DP signal, based on the detection signals S1 and S2 from the bus monitor circuit 88. The holding circuit 50 holds the detected values VDM1 and VDM2 that are the second voltage level information of the DM signal, based on the detection signals S3 and S4 from the bus monitor circuit 88.

Specifically, at the time of an HS-mode host chirp, the bus monitor circuit 88 turns the detection signals S1 and S3 to an active label. For example, at a given timing in the period of an HS-mode host chirp, the detection signals S1 and S3 are changed to an active label such as the H level. Accordingly, the holding register 41 holds, as the detected value VDP1, the first voltage level information of the DP signal at the time of the HS-mode host chirp. Also, the holding register 51 holds, as the detected value VDM1, the second voltage level information of the DM signal at the time of an HS-mode host chirp. In addition, the bus monitor circuit 88 turns the detection signals S2 and S4 to an active label at the time of an FS-mode host chirp. For example, at a given timing in the period of an FS-mode host chirp, the detection signals S2 and S4 are changed to an active label. Accordingly, the holding register 42 holds, as the detected value VDP2, the first voltage level information of the DP signal at the time of the FS-mode host chirp. Also, the holding register 52 holds, as the detected value VDM2, the second voltage level information of the DM signal at the time of the FS-mode host chirp.

With such a configuration, as a result of the bus monitor circuit 88 monitoring the USB signal state, and the detection signals S1, S2, S3, and S4 being turned to an active label during a period during which host chirp is performed, the voltage level information of the signals DP and DM can be held by the holding circuits 40 and 50 performing a holding operation.

In addition, as shown in FIG. 17, the holding circuit 40 includes the A/D conversion circuit 44 to which the DP signal that is one signal out of the DP signal and the DM signal is input. The holding register 41 holds the A/D-converted value ADP from the A/D conversion circuit 44 as the detected value VDP1. The A/D conversion circuit 44 is a first A/D conversion circuit, and the detected value VDP1 is a first detected value. For example, the holding register 41 holds, as the detected value VDP1, the A/D-converted value ADP at a timing when the detection signal S1 from the bus monitor circuit 88 is turned to an active label. With such a configuration, the A/D conversion circuit 44 converts the voltage level of the DP signal into the digital A/D-converted value ADP, and the holding register 41 can hold this digital A/D-converted value ADP as the detected value VDP1. The computation circuit 62 of the determination voltage generation circuit 60 can then execute computation processing for generating the determination voltage VJP using this digital detected value VDP1 and the like.

Similarly, the holding register 42 holds the A/D-converted value ADP from the A/D conversion circuit 44 as the detected value VDP2. The detected value VDP2 is a second detected value. For example, the holding register 42 holds, as the detected value VDP2, the A/D-converted value ADP at a timing when the detection signal S2 from the bus monitor circuit 88 is turned to an active label.

In addition, the holding circuit 50 includes the A/D conversion circuit 54 to which the DM signal that is the other signal out of the DP signal and the DM signal is input. The holding register 51 holds the A/D-converted value ADM from the A/D conversion circuit 54 as the detected value VDM1. The A/D conversion circuit 54 is a second A/D conversion circuit, and the detected value VDM1 is a third detected value. For example, the holding register 51 holds, as the detected value VDM1, the A/D-converted value ADM at a timing when the detection signal S3 from the bus monitor circuit 88 is turned to an active label. With such a configuration, the A/D conversion circuit 54 converts the voltage level of the DM signal into the digital A/D-converted value ADM, and the holding register 51 can hold this digital A/D-converted value ADM as the detected value VDM1. The computation circuit 72 of the determination voltage generation circuit 70 can then execute computation processing for generating the determination voltage VJM using this digital detected value VDM1.

Similarly, the holding register 52 holds the A/D-converted value ADM of the A/D conversion circuit 54 as the detected value VDM2. The detected value VDM2 is a fourth detected value. For example, the holding register 52 holds, as the detected value VDM2, the A/D-converted value ADM at a timing when the detection signal S4 from the bus monitor circuit 88 is turned to an active label.

In addition, the determination voltage generation circuit 60 includes the computation circuit 62 and the D/A conversion circuit 64. The computation circuit 62 performs computation processing for obtaining the determination voltage VJP based on the detected value VDP1. Accordingly, the determination voltage VJP is determined based on the detected value VDP1. More specifically, the determination voltage VJP is determined based on the detected value VDP1 and the detected value VDP2. The D/A conversion circuit 64 D/A-converts the computed value DQP of the computation circuit 62, and thereby outputs the determination voltage VJP. The determination voltage VJP is a first determination voltage. In addition, the computed value DQP is a computation result value of the computation circuit 62, and is a digital value corresponding to the determination voltage VJP. With such a configuration, as a result of the computation circuit 62 performing digital computation processing that is based on the digital detected value VDP1 and the like, the computed value DQP corresponding to the determination voltage VJP is output, and as a result of the D/A conversion circuit 64 D/A-converting the digital computed value DQP, it is possible to output the determination voltage VJP to the detection circuit 80.

In addition, the determination voltage generation circuit 70 includes the computation circuit 72 and the D/A conversion circuit 74. The computation circuit 72 performs computation processing for obtaining the determination voltage VJM based on the detected value VDM1 and the like. Accordingly, the determination voltage VJM is determined based on the detected value VDM1. More specifically, the determination voltage VJM is determined based on the detected value VDM1 and the detected value VDM2. The D/A conversion circuit 74 then D/A-converts the computed value DQM of the computation circuit 72, and thereby outputs the determination voltage VJM. The determination voltage VJM is a second determination voltage. In addition, the computed value DQM is computation result data of the computation circuit 72, and is a digital value corresponding to the determination voltage VJM.

Next, operations according to this embodiment will be described in more detail. According to this embodiment, the bus monitor circuit 88 that detects the USB bus state is provided, and if a host chirp is started after the device is connected, the detection signals S1 to S4 are output for each host chirp. Note that, usually, an FS-mode host chirp K/J is repeated 2 or 3 times, and an HS-mode host chirp K/J is repeated any number of times, but here, as long as the number of times each of the detection signals S1 to S4 is output is one or larger, any number of output times and any output timing are adopted.

In addition, the A/D conversion circuit 44 is provided on the signal line for DP. The detected value VDP1 when the detection signal S1 of the HS-mode host chirp J is output from the bus monitor circuit 88 is held in the holding register 41, and the detected value VDP2 when the detection signal S2 of the FS-mode host chirp J is output is held in the holding register 42. Similarly, the A/D conversion circuit 54 is provided on the signal line for DM. The detected value VDM1 when the detection signal S3 of the HS-mode host chirp J is output is held in the holding register 51, and the detected value VDM2 when the detection signal S4 of the FS-mode host chirp J is output is held in the holding register 52.

On the signal line for DP, the amplitude of HS packets before device disconnection corresponds to an amplitude APH of the HS-mode host chirp J as described with reference to FIG. 13, and the amplitude of HS packets after device disconnection corresponds to an amplitude APF of the FS-mode host chirp J as described with reference to FIG. 11. Therefore, the determination voltage VJP for disconnection detection on the DP side is set to be a voltage that is higher than APH and lower than APF. Therefore, the computation circuit 62 calculates an optimum computed value DQP such that APH<VJP<APF is satisfied.

In addition, on the signal line for DM, the amplitude of HS packets before device disconnection corresponds to an amplitude AMH of the HS-mode host chirp K as described with reference to FIG. 14, and the amplitude of HS packets after device disconnection corresponds to an amplitude AMF of the FS-mode host chirp K as described with reference to FIG. 12. Therefore, the determination voltage VJM for disconnection detection on the DM is set to a value that is higher than AMH and lower than AMF. Therefore, the computation circuit 72 calculates an optimum computed value DQM such that AMH<VJM<AMF is satisfied.

Moreover, as a result of the D/A conversion circuit 64 on the DP side D/A-converting the computed value DQP at a disconnection detection level on the DP side, the determination voltage VJP on the DP side is generated, and the comparator circuit 81 compares a signal amplitude for DP with the determination voltage VJP at a timing of EOP of SOF. Accordingly, determination on disconnection detection on the DP side can be performed at an optimum disconnection detection level calculated based on the host chirp.

Similarly, as a result of the D/A conversion circuit 74 on the DM side D/A-converting the computed value DQM at a disconnection detection level on the DM side, the determination voltage VJM on the DM side is generated, and the comparator circuit 82 compares a signal amplitude for DM with the determination voltage VJM at a timing of EOP of SOF. Accordingly, determination on disconnection detection on the DM side can be performed at an optimum disconnection detection level calculated based on the host chirp.

When one of the comparison result signal VCP of the comparator circuit 81 on the DP side and the comparison result signal VCM of the comparator circuit 82 on the DM side is turned to the H level that is an active label, the disconnection detection signal HSDIS is also turned to the H level, and thus the host determines that the device is disconnected, and can perform the following processing.

Here, the determination voltages VJP and VJM can be respectively obtained using computation equations, namely VJP=((APH+APF)/2)−70 and VJM=((AMH+AMF)/2)−70, for example. The computation circuits 62 and 72 perform computation processing that is based on these computation equations, for example.

For example, when no component is provided on the route of USB, and there is no internal resistance of a component between the host and the device, the amplitudes APH and AMH of the HS-mode host chirp K/J are expressed as ((45Ω×45Ω)/(45Ω+45Ω))×17.78 mA=400.05 mV, which is about 400 mV. In addition, the amplitudes APF and AMF of the FS-mode host chirp K/J are about 800 mV. Thus, VJP=VJM=((400+800)/2)−70=530 mV is generated as a determination voltage. Therefore, the determination voltages VJP and VJM are set such that 525 mV<VDIS<625 mV, which represents the range of the disconnection detection level VDIS according to the USB standard.

On the other hand, assume that a component is provided on the route of USB, and 40Ω, which is the internal resistance of the component, is add to each of the signal lines for DP and DM. In this case, the amplitudes APH and AMH of the HS-mode host chirp K/J are expressed as ((45Ω× (45Ω+40Ω+40Ω))/(45Ω+(45Ω+40Ω+40Ω)))×17.78 mA=588.31 mV, which is about 588 mV. Also, the amplitudes APF and AMF of the FS-mode host chirp K/J are about 800 mV. Therefore, an equation VJP=VJM=((588+800)/2)−70=624 mV is generated as a determination voltage. Therefore, the determination voltages VJP and VJM are set such that 525 mV<VDIS<625 mV, which represents the range of the disconnection detection level VDIS according to the USB standard.

Note that, according to this embodiment, the determination voltage VJP on the DP side is generated on the DP side, and the determination voltage VJM on the DM side is generated on the DM side, and the determination voltage VJP and the determination voltage VJM are input as voltages for the comparator circuits 81 and 82 on both sides to perform comparison. In general USB devices, the route for DP and the route for DM are symmetric, and thus terminal resistances and internal resistances of components on the both sides are the same. In addition, the current source is common between DP and DM, and thus there is no large difference in amplitude between the host chirp J on the DP side and the host chirp K on the DM side. Therefore, a modification can also be adopted in which, instead of individually generating both a determination voltage on the DP side and a determination voltage on the DM side, a determination voltage on only one of the both sides is generated, and this determination voltage is input as a voltage for the comparator circuits 81 and 82 on the both sides to perform comparison.

In addition, according to this embodiment, a detected value of device disconnection is calculated based on the amplitude of an FS-mode host chirp when the terminal resistor of the device is off and the amplitude of an HS-mode host chirp when the terminal resistor of the device is on, and a determination voltage is generated. A major issue with the configurations of USB devices in recent years is that, when the amplitude of HS packets when the device is connected increases due to the internal resistance of a component that is added to the USB route, and a disconnection detection level is thereby set to be in the vicinity of 525 mV that is a lower limit, a false detection of the device being disconnected is made when the device is connected. In contrast, if the host does not increase a drive current, the amplitude of HS packets after device disconnection is not different from that of a conventional configuration, and, also, the amplitude at this time does not directly affect a false detection operation for disconnection, and thus does not necessarily need to be reflected on a detected value of device disconnection. Therefore, a modification can also be adopted in which a detected value of device disconnection is calculated and a determination voltage is generated, by adding a margin based on the amplitude of an HS-mode host chirp corresponding to the amplitude before device disconnection, without considering the amplitude of an FS-mode host chirp corresponding to the amplitude after device disconnection.

In addition, according to this embodiment, the voltage level of a host chirp is obtained using an A/D conversion circuit, a detected value of device disconnection is calculated using a computation circuit, and a determination voltage is generated using a D/A conversion circuit. In such a configuration, accurate control can be performed, but an increase in the circuit scale causes an increase in the cost. Therefore, a modification can also be adopted in which a simple circuit configuration for determining, using a plurality of comparators, which voltage range the voltage level of a host chirp is in, and adjusting a determination voltage based on the determination result is adopted.

4. Circuit Device that Includes Physical Layer Circuit and Bus Switch Circuit

Figure 18:
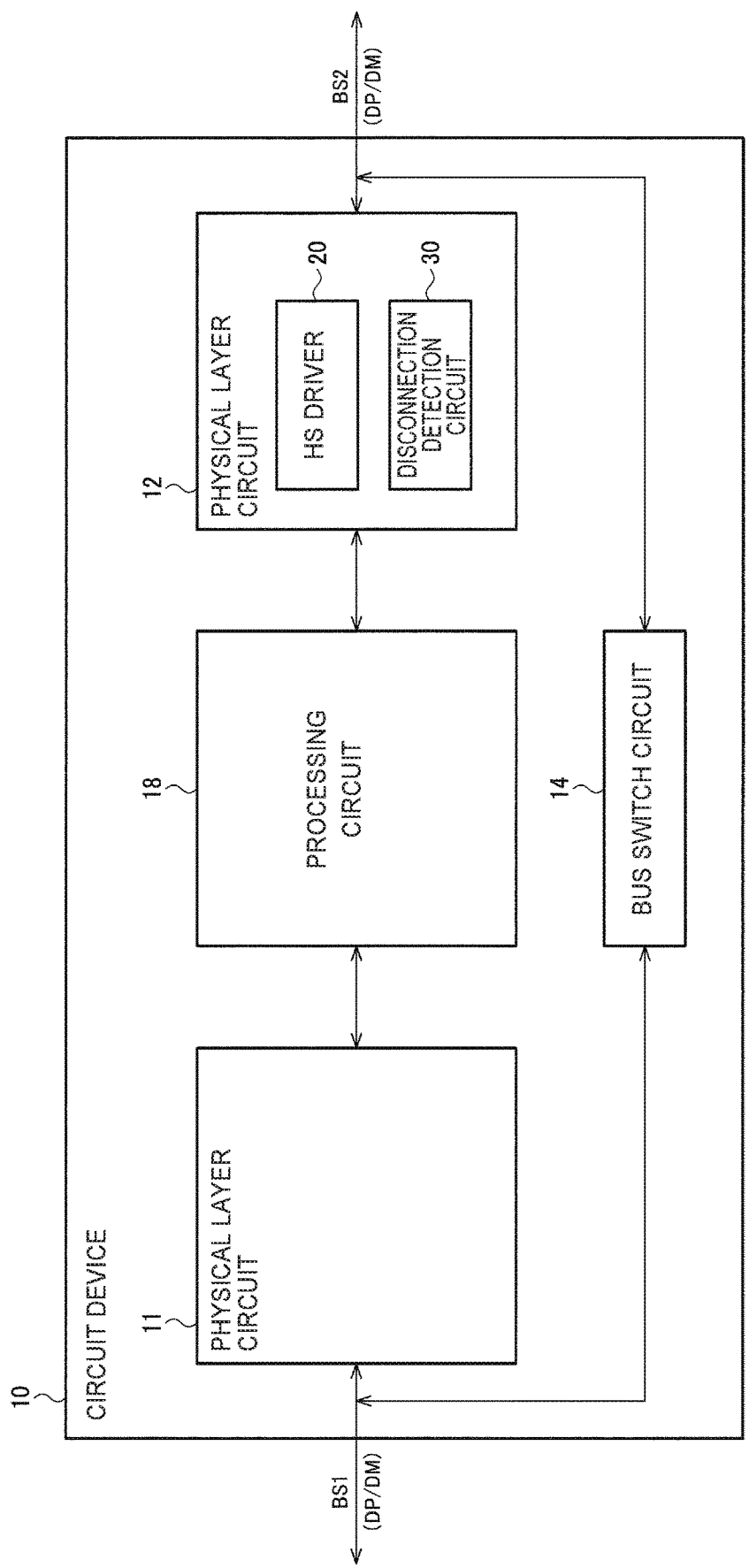
FIG. 18 is a configuration example of a circuit device according to an embodiment of the disclosure.

FIG. 18 shows a configuration example of the circuit device 10 according to this embodiment. This circuit device 10 includes the physical layer circuits 11 and 12 and the bus switch circuit 14. The circuit device 10 may also include a processing circuit 18. The physical layer circuit 11 is a first physical layer circuit, for example, and the physical layer circuit 12 is a second physical layer circuit, for example.

The physical layer circuit 11 is connected to a USB-standard bus BS1. The physical layer circuit 12 is connected to a USB-standard bus BS2. The bus BS1 is a first bus, for example, and the bus BS2 is a second bus, for example. The physical layer circuits 11 and 12 are each configured by a physical layer analog circuit. Examples of the physical layer analog circuit include HS and FS drivers that are transmission circuits, HS and FS receivers that are receiving circuits, various detection circuits, and a pull-up resistance circuit. Note that the processing circuit 18 includes circuits that correspond to the link layer, such as a serial-to-parallel conversion circuit that converts serial data received via USB into parallel data, a parallel-to-serial conversion circuit that converts parallel data into serial data, an elastic buffer, and an NRZI circuit. For example, circuits that correspond to the link layer or the like of a USB transceiver macrocell are included in the processing circuit 18, and HS and FS drivers and receivers and analog circuits such as a detection circuit are included in the physical layer circuits 11 and 12.

The bus BS1 is a bus to which a host is connected, for example, and the bus BS2 is a bus to which a device is connected, for example. It should be noted that this embodiment is not limited to this connection configuration, and can also be applied to a connection mode in which a device is connected to the bus BS1, and a host is connected to the bus BS2. The bus BS1 and the bus BS2 are USB-standard buses that include signal lines for a signal DP and a signal DM that are respectively a first signal and a second signal constituting a differential signal. The bus BS1 and the bus BS2 can include a power supply VBUS and a GND signal line. The USB standard is broadly a given data transfer standard.

One end of the bus switch circuit 14 is connected to the bus BS1, and the other end is connected to the bus BS2. The connection between the bus BS1 and the bus BS2 can be switched on or off. In other words, the bus BS1 and the bus BS2 are electrically connected or electrically disconnected. Switching on or off the connection between the bus BS1 and the bus BS2 is switching on or off, for example, a switch element provided between the DP and the DM signal lines of the bus BS1 and the DP and the DM signal lines of the bus BS2. In addition, connection between circuits and connection between a bus or a signal line and a circuit in this embodiment is electrical connection. Electrical connection is connection that allows transmission of electrical signals, and connection that allows transmission of information using electrical signals. Electrical connection may be connection through a signal line, an active element, and the like.

Specifically, the bus switch circuit 14 switches on the connection between the bus BS1 and the bus BS2 in a first period. More specifically, the bus switch circuit 14 has switch elements provided between the bus BS1 and the bus BS2, and the switch elements are switched on in the first period. Accordingly, the host that is connected to the bus BS1 and the device that is connected to the bus BS2 can directly perform USB signal transfer via the USB buses. Note that, as examples of the switch elements, a first switch element for signals DP and a second switch element for signals DM are provided. In addition, the host is a main controller, for example, and the device is a peripheral device, for example. Also, the bus switch circuit 14 switches off the connection between the bus BS1 and the bus BS2 in a second period. More specifically, in the second period, switch elements provided between the bus BS1 and the bus BS2 are switched off. In this second period, the processing circuit 18 performs transfer processing that is described below.

The processing circuit 18 is a circuit that performs transfer processing and various types of control processing, and can be realized by, for example, a logic circuit obtained by automatic placement and routing, such as a gate array. Note that the processing circuit 18 may be realized by a processor such as a CPU or an MPU.

The processing circuit 18 then performs resynchronization processing. Specifically, the processing circuit 18 performs transfer processing in which packets received from the bus BS1 via the physical layer circuit 11 are transmitted to the bus BS2 via the physical layer circuit 12, and packets received from the bus BS2 via the physical layer circuit 12 are transmitted to the bus BS1 via the physical layer circuit 11, when the bus switch circuit 14 is off. That is to say, the transfer processing is performed in the second period. For example, the transfer processing is performed at least in a portion of the second period. For example, packets are transferred from the bus BS1 to the bus BS2 or from the bus BS2 to the bus BS1 without changing the packet format. At this time, the processing circuit 18 performs predetermined signal processing in this transfer processing. This predetermined signal processing is signal processing for packet transfer, and is for transferring repeat packets corresponding to received packets. For example, the processing circuit 18 performs predetermined packet bit resynchronization processing as the predetermined signal processing. For example, when a packet is received, the bits in the packet are sampled based on a clock signal generated by the circuit device 10. When a packet is transmitted, the bits in the packet are transmitted in synchronization with a clock signal generated by the circuit device 10. When packet transfer is performed on a transfer route that passes through the processing circuit 18, due to the processing circuit 18 performing resynchronization processing that is predetermined signal processing, it is possible to realize high-quality signal transfer in which degraded signal characteristics of USB transmission signals are improved.

Note that, in FIG. 18, the processing circuit 18 that performs such resynchronization processing is provided, but a modification can also be adopted in which resynchronization processing is not performed. In this case, the processing circuit 18 that at least performs control processing of an HS detection handshake to be described later may be provided between the physical layer circuit 11 and the physical layer circuit 12.

Figure 19:
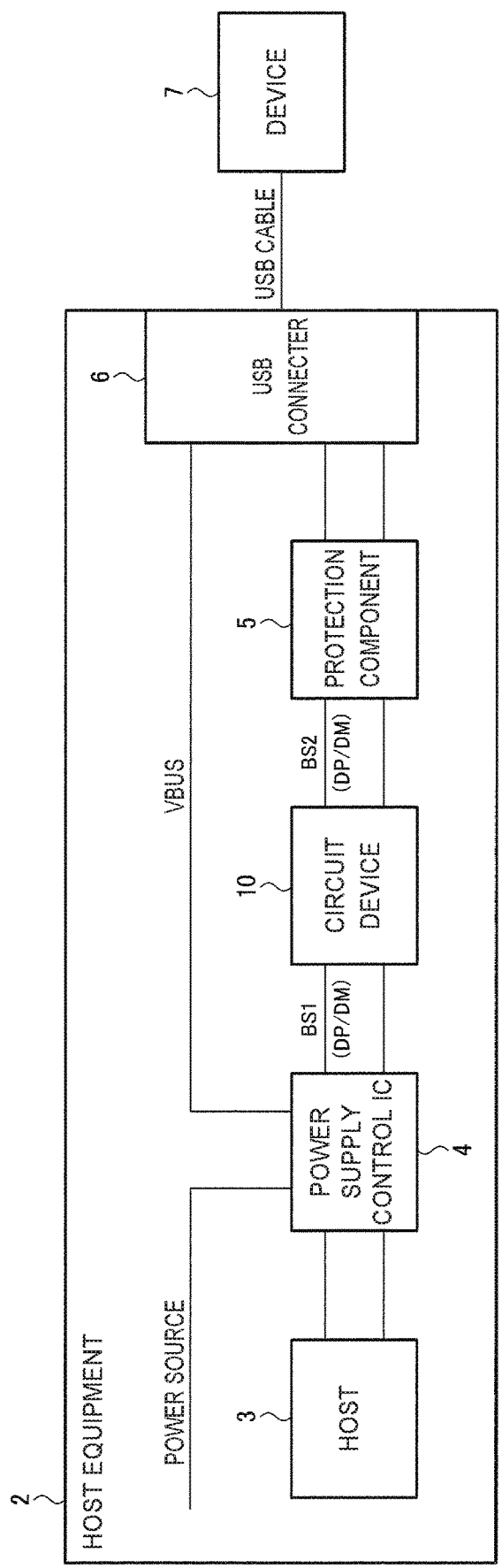
FIG. 19 shows a configuration example of a host that includes a circuit device.

FIG. 19 shows a configuration example of a host 2 that includes the circuit device 10 according to this embodiment. The host 2 includes, for example, a host 3, a power supply control IC 4, the circuit device 10, a protection component 5, and a USB connector 6. The host 3 is a main controller, for example, and is realized by an SOC (System-on-a-Chip), and the like. The power supply control IC 4 is supplied with power, and performs power supply control that complies with the BC protocol or the like. Accordingly, a power source that can cause a large current to flow can be supplied as VBUS to a device 7. The protection component 5 is an electrostatic protection element, for example. The USB connector 6 is a USB receptacle, for example, and is connected to one end of the USB cable. The device 7 connected to the other end of the USB cable is a peripheral device such as a smartphone.

As shown in FIG. 19, the bus BS1 of the circuit device 10 is connected to the host 3 via the power supply control IC 4, and the bus BS2 is connected to the device 7 via the protection component 5, the USB connector 6, and the USB cable. In this manner, the buses BS1 and BS2 do not need to be directly connected to the host 3 and the device 7, and may be connected via a circuit element, a cable, and the like. In addition, in FIG. 19, the host 3 is connected to the bus BS1, and the device 7 is connected to the bus BS2, but the circuit device 10 according to this embodiment can also cope with a connection mode in which the device 7 is connected to the bus BS1 and the host 3 is connected to the bus BS2.

Moreover, in the case of FIG. 19, the device 7 is connected and disconnected via the USB cable, and thus the circuit device 10 needs to perform detection of device disconnection, namely disconnection of the device 7. For example, the disconnection detection circuit 30 in FIG. 18 performs device disconnection detection. In this case, if a configuration is adopted in which the circuit device 10 is provided in the host as in FIGS. 1 to 17, the HS driver of the host 3 may transmit a host chirp, hold voltage level information of the USB at this time, and perform device disconnection detection using a determination voltage that is based on the voltage level information. However, in a case of the circuit device 10 configured to be provided between the host 3 and the device 7 as in FIGS. 18 and 19, in a HS detection handshake period during which a host chirp is transmitted, the bus switch circuit 14 is switched on, and an HS detection handshake is performed between the host 3 and the device 7. Therefore, for example, even if, during the HS detection handshake period, the HS driver of the host 3 transmits a host chirp, holds voltage level information of the USB at this time, and generates a determination voltage, the generated determination voltage is not a determination voltage that makes it possible to appropriately perform device disconnection detection. That is to say, it is not possible to generate an appropriate determination voltage for device disconnection that is suitable for the connection environment of the bus BS2, simply by providing the above-described holding circuit 40 and determination voltage generation circuit 60 in the disconnection detection circuit 30 in FIG. 10. For example, during a period during which the bus switch circuit 14 is on, the HS driver provided in the host 3 transmits a host chirp, and the HS driver 20 provided in the physical layer circuit 12 does not transmit a host chirp. Even if voltage level information of USB when the HS driver of the host 3 is transmitting a host chirp is held, a determination voltage that is based on the voltage level information is not an appropriate determination voltage suitable for the connection environment of the bus BS2. Note that, according to this embodiment, the bus switch circuit 14 switching on connection between the bus BS1 and the bus BS2 is referred to as "the bus switch circuit 14 being switched on" as appropriate. Also, the bus switch circuit 14 switching off connection between the bus BS1 and the bus BS2 is referred to as "the bus switch circuit 14 being switched off" as appropriate.

For example, improvement in the amplitude of HS packets that uses a transmission current adjustment function of the HS driver 20 in addition to improvement in jitter that is realized through resynchronization processing by the processing circuit 18 is conceivable as improvement in the waveform of HS communication that is realized by the circuit device 10. In HS communication between the circuit device 10 and the device 7 that uses HS packets, this transmission current adjustment function of the HS driver 20 is used for adjusting the amplitude of HS packets. Therefore, in order to set a disconnection detection level suitable for the connection environment of the bus BS2, it is desirable for the circuit device 10 to carry out a host chirp using the HS driver 20 and the terminal resistor of the circuit device 10 itself. However, as described above, in the circuit device 10 that has a configuration in which a host chirp from the host 3 is transmitted to the device 7 via the bus switch circuit 14, there is the issue that it is not possible to appropriately set a determination voltage for disconnection detection suitable for the connection environment.

In view of this, according to this embodiment, the physical layer circuit 12 holds the first voltage level information measured when a host chirp is transmitted to the bus BS2 during a period during which the bus switch circuit 14 is off. For example, the physical layer circuit 12 holds the first voltage level information when the HS driver 20 is transmitting a host chirp. For example, the physical layer circuit 12 measures and holds the first voltage level information of the bus BS2 when a host chirp is transmitted. Here, the first voltage level information is voltage level information of one signal out of the DP signal and the DM signal of USB. The physical layer circuit 12 then performs device disconnection detection on the bus BS2, based on the first voltage level information that is held therein. For example, the physical layer circuit 12 performs device disconnection detection on the bus BS2, using a determination voltage generated based on the first voltage level information.

As described above, if device disconnection detection is performed based on the first voltage level information when a host chirp is transmitted to the bus BS2 during a period during which the bus switch circuit 14 is off, device disconnection detection can be performed using an optimum determination voltage suitable for the connection environment of the bus BS2. For example, during HS communication that is performed by using HS packets, the bus switch circuit 14 is switched off, and HS packets are transmitted to the device 7 by the HS driver 20 of the physical layer circuit 12. During this HS communication, for example, the waveform is improvement as a result of improving the amplitude of HS packets using the transmission current adjustment function of the HS driver 20. Detecting device disconnection is detecting disconnection of the device 7 on the bus BS2. Therefore, in device disconnection detection in this case, during a period during which the bus switch circuit 14 is off, a determination voltage that is based on the first voltage level information of the DP signal or the DM signal on the bus BS2 when a host chirp is transmitted to the bus BS2 is appropriate. In this regard, according to this embodiment, the physical layer circuit 12 holds the first voltage level information measured when a host chirp is transmitted to the bus BS2 during a period during which the bus switch circuit 14 is off, and performs device disconnection detection on the bus BS2 based on the first voltage level information held by the physical layer circuit 12. Therefore, it is possible to realize device disconnection detection using an optimum determination voltage suitable for the connection environment of the bus BS2.

In addition, as shown in FIG. 18, the physical layer circuit 12 includes the HS driver 20 and the disconnection detection circuit 30. The HS driver 20 is an HS mode transmission circuit on the bus BS2. The disconnection detection circuit 30 is a circuit that performs device disconnection detection on the bus BS2. For example, the HS driver 20 transmits HS packets in the HS mode by driving the bus BS2 of the USB through current drive that uses a current source. Then, when the device 7 is disconnected on the bus BS2, the disconnection detection circuit 30 detects the disconnection. The disconnection detection circuit 30 then holds the first voltage level information measured when the HS driver 20 is transmitting a host chirp, during a period during which the bus switch circuit 14 is off. For example, the disconnection detection circuit 30 holds the first voltage level information that is voltage level information of one signal out of the DP signal and the DM signal when the host chirp K/J is transmitted by the HS driver 20. The disconnection detection circuit 30 then performs device disconnection detection, based on the first voltage level information held by the disconnection detection circuit 30. For example, the disconnection detection circuit 30 generates a determination voltage based on the first voltage level information held therein, and performs device disconnection detection on the bus BS2 during HS communication, for example. With such a configuration, the HS driver 20 transmits a host chirp when the bus switch circuit 14 is off, the first voltage level information of the DP signal or the DM signal of the bus BS2 at this time is held, and, using the first voltage level information that is held, it is possible to realize device disconnection detection on the bus BS2. Therefore, it is possible to realize device disconnection detection using an optimum determination voltage suitable for the connection environment of the bus BS2.

Figure 20:
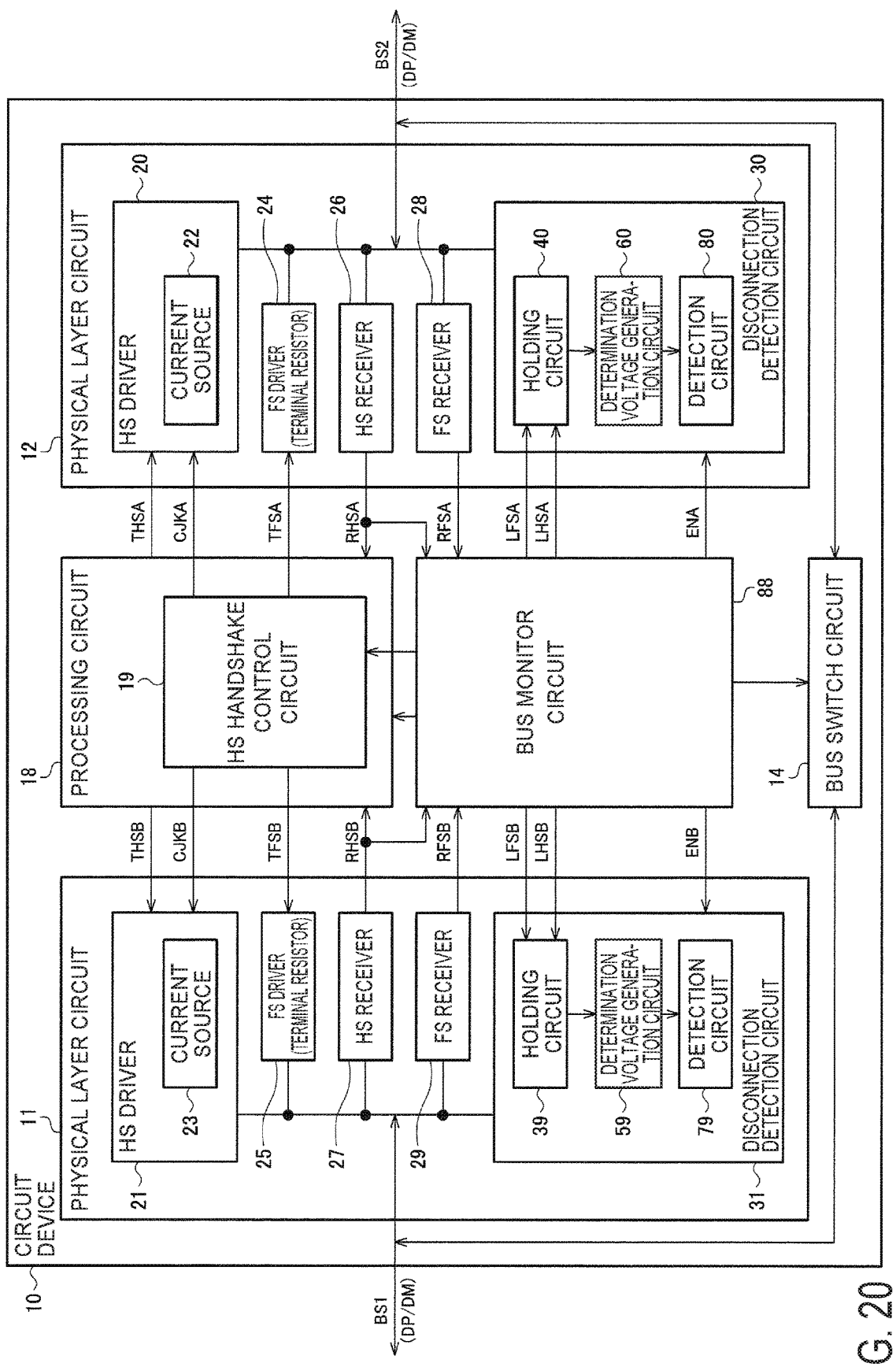
FIG. 20 shows an detailed configuration example of a circuit device.

FIG. 20 shows a detailed configuration example of the circuit device 10. Note that the circuit device 10 is not limited to the configuration in FIG. 20, and various modification can be made such as omitting some of the constituent elements, and adding another constituent element, for example.

The circuit device 10 includes the physical layer circuits 11 and 12, the bus switch circuit 14, the processing circuit 18, and the bus monitor circuit 88. The physical layer circuit 12 includes the HS driver 20 that includes the current source 22, an FS driver 24, an HS receiver 26, an FS receiver 28, and the disconnection detection circuit 30. The physical layer circuit 11 includes an HS driver 21 that includes a current source 23, an FS driver 25, an HS receiver 27, an FS receiver 29, and a disconnection detection circuit 31.

The processing circuit 18 includes an HS handshake control circuit 19. The HS handshake control circuit 19 is a control circuit for an HS detection handshake, and has a state machine and a timer provided therein.

The disconnection detection circuit 30 includes the holding circuit 40, the determination voltage generation circuit 60, and the detection circuit 80. The configuration and operations of the disconnection detection circuit 30, the holding circuit 40, the determination voltage generation circuit 60, and the detection circuit 80 are similar to those described with reference to FIGS. 1 to 17, and a detailed description thereof is omitted. In addition, the disconnection detection circuit 31 includes a holding circuit 39, a determination voltage generation circuit 59, and a detection circuit 79. The configuration and operations of the disconnection detection circuit 31, the holding circuit 39, the determination voltage generation circuit 59, and the detection circuit 79 are similar to those of the disconnection detection circuit 30, the holding circuit 40, the determination voltage generation circuit 60, and the detection circuit 80, and thus a detailed description thereof is omitted.

The bus monitor circuit 88 performs a monitor operation of monitoring the bus BS1 or the bus BS2. Specifically, the bus monitor circuit 88 performs a monitor operation of monitoring the bus BS1 or the bus BS2, using the physical layer circuit 11 or the physical layer circuit 12. More specifically, this is a monitor operation for monitoring the state of the bus BS1 or the bus BS2 based on signals from the physical layer circuit 11 or the physical layer circuit 12. The bus switch circuit 14 then switches on or off the connection between the bus BS1 and the bus BS2 based on the monitoring result from the bus monitor circuit 88. For example, based on the monitoring result from the bus monitor circuit 88, the bus switch circuit 14 switches on the connection between the bus BS1 and the bus BS2 in the first period, and switches off this connection in the second period. Also, the processing circuit 18 performs transfer processing through the above-described resynchronization processing in the second period. Accordingly, predetermined signal processing such as packet bit resynchronization processing is executed by the processing circuit 18. In other words, packet repeat processing is performed. Accordingly, it is possible to realize high-quality signal transfer in which degraded signal characteristics of USB transmission signals are improved.

An HS signal of the bus BS2 is received by the HS receiver 26, and is input as an HS reception signal RHSA to the processing circuit 18 and the bus monitor circuit 88. The HS reception signal RHSA is then resynchronized by the processing circuit 18, is input as an HS transmission signal THSB to the HS driver 21, and is output to the bus BS1 by the HS driver 21. Similarly, an HS signal of the bus BS1 is received by the HS receiver 27, and is input as an HS reception signal RHSB to the processing circuit 18 and the bus monitor circuit 88. The HS reception signal RHSB is then resynchronized by the processing circuit 18, is input as an HS transmission signal THSA to the HS driver 20, and is output to the bus BS2 by the HS driver 20.

An FS signal of the bus BS2 is received by the FS receiver 28, and is input as an FS reception signal RFSA to the bus monitor circuit 88. Similarly, an FS signal of the bus BS1 is received by the FS receiver 29, and is input as an FS reception signal RFSB to the bus monitor circuit 88.

The HS handshake control circuit 19 generates an output signal CJKA of the host chirp K/J. The output signal CJKA is then input to the HS driver 20, and is output to the bus BS2 by the HS driver 20. Similarly, the HS handshake control circuit 19 generates an output signal CJKB of the host chirp K/J. The output signal CJKB is then input to the HS driver 21, and is output to the bus BS1 by the HS driver 21.

In addition, the HS handshake control circuit 19 generates an FS transmission signal TFSA, outputs the FS transmission signal TFSA to the FS driver 24, generates an FS transmission signal TFSB, and outputs the FS transmission signal TFSB to the FS driver 25.

The bus monitor circuit 88 generates a holding signal LFSA of the host chirp K/J (FS), outputs the holding signal LFSA to the holding circuit 40 of the disconnection detection circuit 30, generates a holding signal LFSB of the host chirp K/J (FS), and outputs the holding signal LFSB to the holding circuit 39 of the disconnection detection circuit 31. As a result of the holding signals LFSA and LFSB changing from "inactive" to "active", voltage level information on the bus BS2 and voltage level information on the bus BS1 when the host chirp K/J (FS) is transmitted are respectively held in the holding circuits 40 and 39. Also, the bus monitor circuit 88 generates a holding signal LHSA of the host chirp K/J (HS), outputs the holding signal LHSA to the holding circuit 40, generates a holding signal LHSB of the host chirp K/J (HS), and outputs the holding signal LHSB to the holding circuit 39. As a result of the holding signals LHSA and LHSB changing from "inactive" to "active", voltage level information on the bus BS2 and voltage level information on the bus BS1 when the host chirp K/J (HS) is transmitted are respectively held in the holding circuits 40 and 39.

In addition, the bus monitor circuit 88 generate an enable signal ENA for performing enable control of the disconnection detection circuit 30, outputs the enable signal ENA to the disconnection detection circuit 30, generates an enable signal ENB for performing enable control of the disconnection detection circuit 31, and outputs enable signal ENB to the disconnection detection circuit 31. As a result of the enable signals ENA and ENB becoming active, operations of the disconnection detection circuits 30 and 31 are enabled.

According to this embodiment, before an HS detection handshake is performed between the host 3 and the device 7 via the bus switch circuit 14 when the device is connected, an HS detection handshake is temporarily carried out between the circuit device 10 and the device 7. The amplitude level of the host chirp K/J at this time is then held, and device disconnection detection is performed using a determination voltage generated based on the value of the amplitude level. Accordingly, when the device 7 is connected to the circuit device 10, the bus switch circuit 14 is first switched off, an operation of the HS handshake control circuit 19 is switched on, and an HS detection handshake is carried out between the circuit device 10 and the device 7. The amplitude level of the host chirp K/J at this time is held, and a determination voltage to be used by the disconnection detection circuit 30 is generated based on the value of the amplitude level. The amplitude level of the host chirp K/J is the level of the first voltage level information. Next, the bus switch circuit 14 is switched on, an operation of the HS handshake control circuit 19 is switched off, and notification that the device 7 is connected to the host 3 is performed. Accordingly, an HS detection handshake is performed between the host 3 and the device 7 connected via the bus switch circuit 14, and HS connection between the host 3 and the device 7 is established. Subsequently, as a result of the circuit device 10 switching the signal path from a path that passes through the bus switch circuit 14, to a path that passes through the physical layer circuit 11, the processing circuit 18, and the physical layer circuit 12, HS communication that accompanies resynchronization processing that is performed by the circuit device 10 is started. At this time, the circuit device 10 causes the disconnection detection circuit 30 to perform device detection using an optimum determination voltage that is based on the amplitude level of the host chirp K/J performed by the circuit device 10 itself.

Next, operations according to this embodiment will be described in detail with reference to FIGS. 21 and 22. Note that processing for detecting device disconnection on the bus BS2 will be mainly described below as an example, but processing for detecting device disconnection on the bus BS1 can be realized similarly.

First, assume a state where the device 7 is not connected to the circuit device 10 in an initial state. At this time, the signal path of the circuit device 10 is set to a path that passes through the bus switch circuit 14, and the bus BS1 on the host side and the bus BS2 on the device side are connected to each other via the bus switch circuit 14.

When the device is connected to the circuit device 10 (timing t1), the path that passes through the bus switch circuit 14 is maintained as the signal path of the circuit device 10. At this time, in the host 2, the power supply control IC 4 provided between the host 3 and the circuit device 10 communicates with the device 7 via the bus switch circuit 14, using a communication protocol that does not comply with the USB standard such as the BC protocol, and power supply capability to the device 7 and the like are determined.

When an agreement is made regarding this power supply capability, the device 7 turns the bus BS2 into a state of FS_J by enabling the pull-up resistor of 1.5 kΩ connected to the signal line for DP of the bus BS2 (timing t2). When this first FS_J from the device 7 is detected, the circuit device 10 switches off the bus switch circuit 14 using the bus monitor circuit 88, closes the signal path between the host 3 and the device 7, and shut off notification of FS_J from the device 7 to the host 3. According to the USB standard, when FS_J continues for 2.5 μs or longer (TDCNN), the host 3 can perform device connection detection, and thus the above-mentioned shutting off needs to be performed during this time.

Note that, if LS_J, instead of FS_J is detected at this time, the device 7 in an LS mode is connected to the circuit device 10, and thus the circuit device 10 maintains the bus switch circuit 14 in an on state, causing an LS signal to pass between the host 3 and the LS device 7, such that the host 3 and the device 7 perform LS communication.

After notification of FS_J from the device 7 to the host 3 is shut off, the circuit device 10 causes the bus monitor circuit 88 to determine the values of the FS reception signal RFSA that is output from the FS receiver 28 in FIG. 20 and the FS reception signal RFSB that is output from the FS receiver 29 (timing t2). In this case, the bus BS2 is in the state of FS_J, and thus the bus monitor circuit 88 can detect FS_J from the FS reception signal RFSA. Accordingly, the circuit device 10 can determine that the device 7 is connected to the bus BS2, and the host 3 is connected to the bus BS1. Note that, in the circuit device 10 according to this embodiment, the device 7 is allowed to be connected to the bus BS1, and the host 3 is also allowed to be connected to the bus BS2. In this case, the bus BS1 is in the state of FS_J, and thus, as a result of the bus monitor circuit 88 detecting FS_J from the FS reception signal RFSB, the circuit device 10 can determine that the device 7 is connected to the bus BS1, and the host 3 is connected to the bus BS2.

In addition, the circuit device 10 detects that the bus monitor circuit 88 has presented FS_J stably for a certain period of time (timing t2 to t3). In the USB standard, a stable time of 100 ms or longer (TATTDB) is stipulated, and thus the circuit device 10 confirms whether or not FS_J has continued for this stable time.

After detecting FS_J that is stable for a certain period of time, the circuit device 10 switches on an operation of the HS handshake control circuit 19 using the bus monitor circuit 88. The HS handshake control circuit 19 then causes the FS driver 24 to output SE0 to the bus BS2 on the device side using the FS transmission signal TFSA (timing t3). Accordingly, bus reset is performed from the circuit device 10 to the device 7, and an HS detection handshake is started. Note that the bus BS1 on the host side is in the state of SE0 due to pull-down resistance of the host 3, and thus the circuit device 10 does not need to perform bus control.

After bus reset to the device 7 has been output, as a result of determining the value of the HS reception signal RHSA from the HS receiver 26 using the bus monitor circuit 88, the circuit device 10 detects the device chirp K that is returned from the device 7 (timing t4). In the USB standard, a start time of the device chirp K (timing t3 to t4: TFILTSE0) and a duration time (timing t4 to t5: TUCH/TUCHEND) are stipulated, and thus it is determined, using the bus monitor circuit 88, that these times are prescribed times.

Note that, if the device chirp K is not detected, it is indicated that the FS device 7 that does not support HS mode is connected to the circuit device 10, and thus the circuit device 10 switches off an operation of the HS handshake control circuit 19, switches on the bus switch circuit 14, causes an FS signal to pass between the host 3 and the FS device 7, and causes the host 3 and the FS device 7 to perform FS communication.

After detecting the device chirp K of the prescribed times, the circuit device 10 starts transmitting host chirps to the device 7 (timing t6). The HS handshake control circuit 19 repeatedly outputs the output signals CJKA of the host chirp J and the host chirp K at every predetermined time (TDCH-BIT), and as a result, the host chirp J, the host chirp K, the host chirp J, the host chirp K . . . are output from the HS driver 20 to the device 7 via the bus BS2. The circuit device 10 outputs host chirps to the device 7, and, at the same time, causes the bus monitor circuit 88 to monitor the host chirps that are output to the bus BS2, generates the following signals, and outputs the signals to the disconnection detection circuit 30.

Specifically, before the device 7 switches on the terminal resistor (timing t6 to t7), the HS driver 20 outputs, to the bus BS2, the host chirp K/J (FS) whose amplitude is about 800 mV. When the host chirp J (FS) is detected, the bus monitor circuit 88 turns the holding signal LFSA of the host chirp J (FS) to the H level, and outputs the holding signal LFSA to the holding circuit 40. Accordingly, the voltage level information of the host chirp J (FS) is held in the holding circuit 40. In addition, when the host chirp K (FS) is detected, the bus monitor circuit 88 turns the holding signal LFSA of the host chirp K (FS) to the H level, and outputs the holding signal LFSA to the holding circuit 40. Accordingly, the voltage level information of the host chirp K (FS) is held in the holding circuit 40.

After the device 7 switches on the terminal resistor (timing t7 to t8), the HS driver 20 outputs, to the bus BS2, the host chirp K/J (HS) whose the amplitude is about 400 mV. When the host chirp J (HS) is detected, the bus monitor circuit 88 turns the holding signal LHSA of the host chirp J (HS) to the H level, and outputs the holding signal LHSA to the holding circuit 40. Accordingly, the voltage level information of the host chirp J (HS) is held in the holding circuit 40. In addition, when the host chirp K (HS) is detected, the bus monitor circuit 88 turns the holding signal LHSA of the host chirp K (HS) to the H level, and outputs the holding signal LHSA to the holding circuit 40. Accordingly, the voltage level information of the host chirp K (HS) is held in the holding circuit 40.

In this manner, voltage level information that is the amplitude level of the host chirp K/J (FS) and voltage level information that is the amplitude level of the host chirp K/J (HS) are held in the holding circuit 40 of the disconnection detection circuit 30, using these holding signals LFSA and LHSA. The determination voltage generation circuit 60 then generates a determination voltage for disconnection detection based on the held voltage level information.

After generation of the determination voltage for disconnection detection has completed, the circuit device 10 ends output of host chirps (timing t8). The circuit device 10 switches off an operation of the HS handshake control circuit 19 so as to stop output of SE0 from the FS driver 24 and output of host chirps from the HS driver 20, and switches on the bus switch circuit 14 so as to cause the signals between the host 3 and the device 7 to pass. At this time, the host 3 does not recognize the device connection and is in a stopped state, and thus presents SE0 to the bus BS1, and the SE0 is presented to the bus BS2 on the device side through the bus switch circuit 14. On the other hand, since an HS detection handshake has completed due to host chirps, and thus, from this point forward, the device 7 waits for receiving HS packets such as SOF, expecting that HS communication will be performed by the host 3. However, the host 3 is in a stopped state, and thus the device 7 cannot obtain HS packets. In FIG. 21, this state is described as HS connection suspension.

Figure 22:
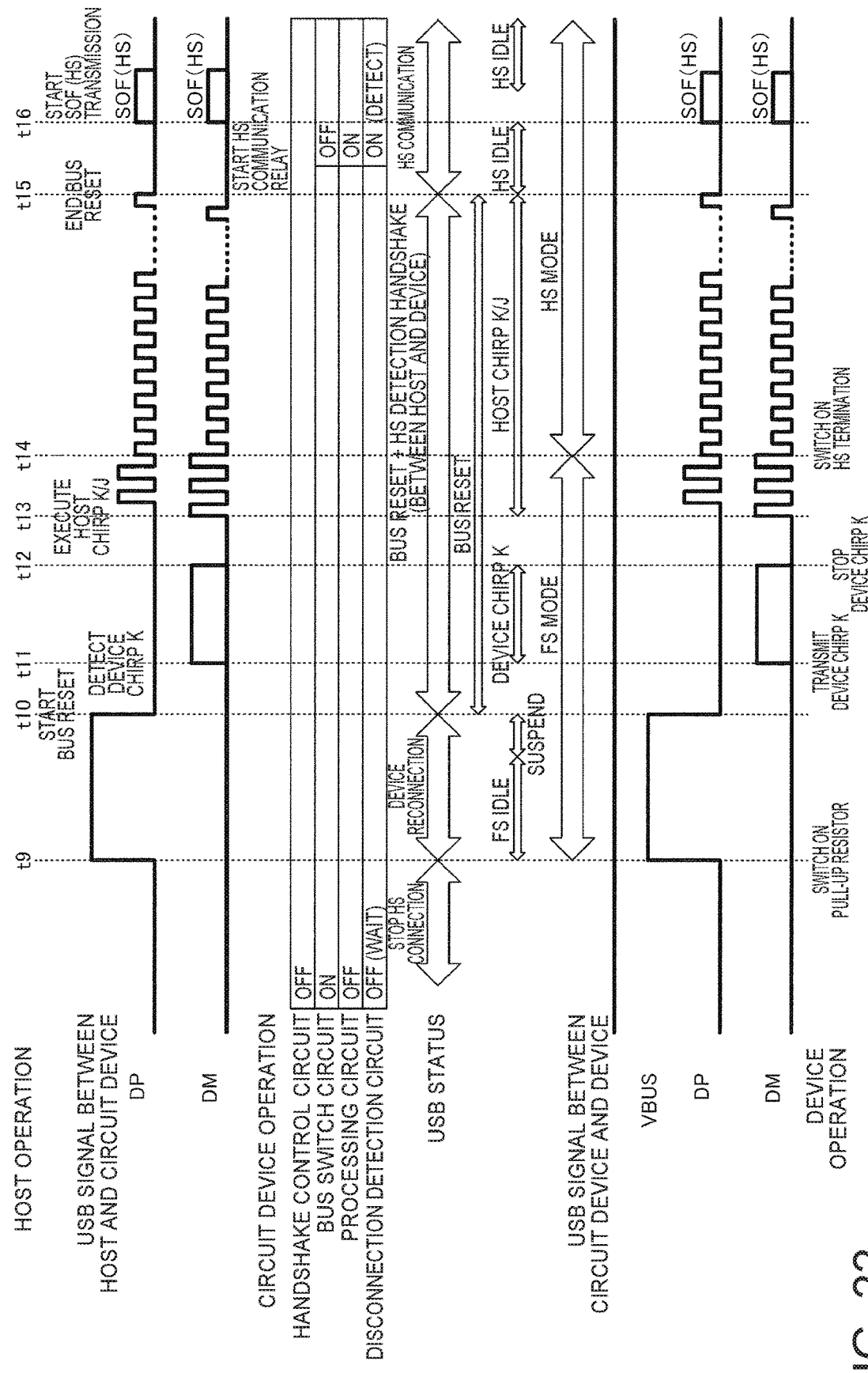
FIG. 22 is a timing waveform chart illustrating operations of a circuit device.

As shown in FIG. 22, if SE0 continues for a certain period of time (TWTREV) after the device 7 that is waiting for HS communication is connected to the host 3 that is in a stopped state, the device 7 enables the pull-up resistor for DP in order to present a suspend (timing t9). Accordingly, the bus BS2 enters the state of FS_J. When this second FS_J from the device 7 is detected, the circuit device 10 maintains the on-state of the bus switch circuit 14 using the bus monitor circuit 88, and passes notification of FS_J from the device 7 to the host 3, unlike the first FS_J. According to the USB standard, if FS_J continues for 2.5 µs or longer (TDCNN), the host 3 can detect device connection, and thus the host 3 starts connection with the device 7 from then on.

After the host 3 detects connection of the device 7, an HS detection handshake between the host 3 and the device 7 is performed via the bus switch circuit 14 of the circuit device 10 (timing t10 to t15). During this time, the circuit device 10 causes the bus monitor circuit 88 to keep monitoring the state of the bus until host chirps ends.

After the HS detection handshake between the host 3 and the device 7 has completed, the circuit device 10 switches off the bus switch circuit 14 using the bus monitor circuit 88, and switch on an operation of the processing circuit 18. Accordingly, the signal path is switched from the path that passes through the bus switch circuit 14, to the path that passes through the physical layer circuit 11, the processing circuit 18, and the physical layer circuit 12. Therefore, HS communication between the host 3 and the device 7 is performed along with resynchronization processing that is performed by the circuit device 10, and improvement in the HS communication waveform is realized.

At this time, the circuit device 10 switches on the disconnection detection circuit 30 on the device side using the bus monitor circuit 88, and prepares for disconnection detection of the device 7. For example, as a result of the bus monitor circuit 88 turning the enable signal ENA of the disconnection detection circuit 30 to the H level, the disconnection detection circuit 30 is switched on, and disconnection detection that is performed by the detection circuit 80 is enabled. Accordingly, the detection circuit 80 performs determination on disconnection detection using a determination voltage generated by the determination voltage generation circuit 60, and thus can appropriately perform device disconnection detection using an optimum determination voltage for the connection environment.

As described above, according to this embodiment, an optimum disconnection detection level for the current connection condition can be set also in the circuit device 10 that is a relay device between the host 3 and the device 7. Therefore, even in a case of a connection configuration of a recent USB device in which various components are add to a USB bus as in FIG. 19, a stable connection state can be realized without false detection for disconnection being made when a device and a host are connected.

Figure 21:
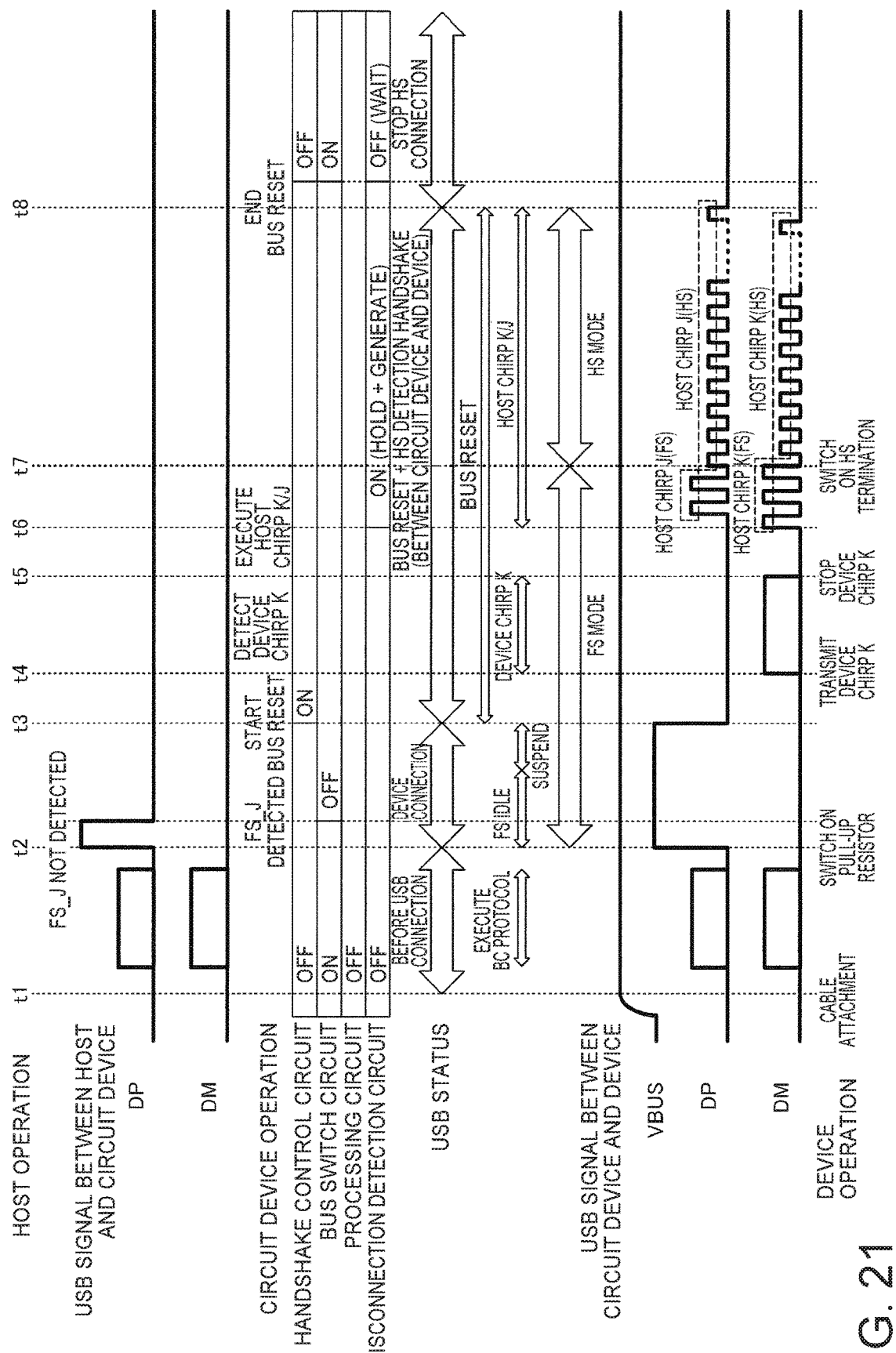
FIG. 21 is a timing waveform chart illustrating operations of a circuit device.

In addition, according to this embodiment, after USB cable attachment at timing t1 in FIG. 21, when FS_J is detected on the bus BS2 after timing t2, the bus switch circuit 14 is switched from on to off. That is to say, the bus switch circuit 14 switches connection between the bus BS1 and the bus BS2 from on to off. Specifically, when the device 7 enables the pull-up resistor of the signal line for DP, and the bus BS2 enters the state of FS_J, the bus monitor circuit 88 detects this, and switches the bus switch circuit 14 from on to off. As a result of the bus switch circuit 14 being switched off in this manner, notification of FS_J performed by the device 7 is not transmitted to the host 3. In addition, as indicated by t6 to t8, during the HS detection handshake period after the bus switch circuit 14 has been switched off, the HS driver 20 transmits a host chirp to the bus BS2. Specifically, the HS driver 20 alternately transmits the host chirp J and the host chirp K. The disconnection detection circuit 30 then holds the first voltage level information measured when the HS driver 20 is transmitting a host chirp. Specifically, the disconnection detection circuit 30 holds the first voltage level information that is the amplitude level on the bus BS2 when the host chirp J and the host chirp K are transmitted.

With such a configuration, as a result of the bus switch circuit 14 being switched off when FS_J from the device 7 is detected, transmission of this FS_J to the host 3 is prevented. In the subsequent HS detection handshake period, the first voltage level information of the bus BS2 when the HS driver 20 transmitting a host chirp is held, and device disconnection detection on the bus BS2 can be appropriately performed using a determination voltage for disconnection detection that is based on this first voltage level information.

In addition, according to this embodiment, after the HS detection handshake period ends at timing t8 in FIG. 21, the bus switch circuit 14 is switched from off to on. That is to say, the bus switch circuit 14 switches connection between the bus BS1 and the bus BS2 from off to on. Specifically, when the HS detection handshake period ends, the bus monitor circuit 88 switches the bus switch circuit 14 from off to on.

With such a configuration, as a result of the bus switch circuit 14 being switched on after the first voltage level information for disconnection detection is held during the HS detection handshake period, the host 3 and the device 7 are connected via the bus switch circuit 14. Accordingly, an HS detection handshake is performed again between the host 3 and the device 7, and HS communication connection between the host 3 and the device 7 can be established. It is also possible to realize device disconnection detection that is based on the first voltage level information that has been held.

In addition, according to this embodiment, when LS_J is detected on the bus BS2 after the cable attachment at timing t1 in FIG. 21, the bus switch circuit 14 is maintained in an on-state without being switched from on to off. That is to say, the bus switch circuit 14 maintains connection between the bus BS1 and the bus BS2 in an on-state without switching it from on to off. Specifically, as described above, when FS_J is detected after cable attachment, an HS detection handshake for holding the first voltage level information for disconnection detection is performed, but if LS_J is detected, such an HS detection handshake is not performed. As a result of the bus switch circuit 14 being maintained in the on-state, LS communication is performed between the host 3 and the LS device 7.

In addition, according to this embodiment, if the device chirp K is not detected on the bus BS2 during the bus reset period after cable attachment, the bus switch circuit 14 is switched from off to on. That is to say, the bus switch circuit 14 switches connection between the bus BS1 and the bus BS2 from off to on. For example, in FIG. 21, after the bus reset period is started at timing t3 after cable attachment, the device 7 transmits the device chirp K. When this device chirp K is detected, an HS detection handshake is performed. In contrast, if the device chirp K is not detected, it is determined that the FS device 7 that does not support HS mode is connected to the circuit device 10, and the bus switch circuit 14 is switched from off to on. Accordingly, FS communication can be performed between the host 3 and the FS device 7 via the bus switch circuit 14 that has been switched on.

In addition, as described in detail with reference to FIG. 1 and the like, the disconnection detection circuit 30 includes the holding circuit 40 that holds first voltage level information, the determination voltage generation circuit 60 that generates a first determination voltage based on the first voltage level information, and the detection circuit 80 that performs device disconnection detection based on the first determination voltage, and outputs a disconnection detection signal. The holding circuit 40 is a first holding circuit, and the determination voltage generation circuit 60 is a first determination voltage generation circuit. With such a configuration, the first determination voltage that is a determination voltage for disconnection detection is generated based on a measurement result of the voltage level of one signal out of the DP signal and the DM signal when a host chirp is transmitted, and USB disconnection detection is performed using this first determination voltage.

In addition, as described in detail with reference to FIG. 15, the detection circuit 80 includes the comparator circuit 81 that compares the determination voltage VJP with the voltage of one signal out of the DP signal and the DM signal, and outputs the disconnection detection signal HSDIS based on the comparison result of the comparator circuit 81. The determination voltage VJP is a first determination voltage, and the comparator circuit 81 is a first comparator circuit. If such the comparator circuit 81 is provided, it is possible to perform device disconnection detection, and output the disconnection detection signal HSDIS, as a result of comparing the determination voltage VJP set according to the first voltage level information of a host chirp, with the voltage of one signal out of the DP signal and the DM signal.

In addition, as described with reference to FIG. 16, the disconnection detection circuit 30 includes the holding circuit 50 that holds second voltage level information that is voltage level information of the other signal out of the DP signal and the DM signal, the second voltage level information having been measured when a host chirp is transmitted to the bus BS2, and the determination voltage generation circuit 70 that generates the determination voltage VJM based on the second voltage level information. The holding circuit 50 is a second holding circuit, the determination voltage VJM is a second determination voltage, and the determination voltage generation circuit 70 is a second determination voltage generation circuit. The detection circuit 80 then performs USB disconnection detection based on the determination voltage VJP and the determination voltage VJM, and outputs the disconnection detection signal HSDIS. With such a configuration, USB disconnection detection can be realized using both the determination voltage VJP that is based on voltage level information of one signal out of the DP signal and the DM signal and the determination voltage VJM that is based on voltage level information of the other signal.

Note that, as shown in FIG. 16, the holding circuit 40 may include the holding registers 41 and 42, and the holding circuit 50 may include the holding registers 51 and 52. In addition, the detection circuit 80 may include the comparator circuits 81 and 82, and the output circuit 84. Moreover, the configuration as shown in FIG. 17 can be adopted as a specific configuration of the holding circuits 40 and 50, the determination voltage generation circuits 60 and 70, and the detection circuit 80, for example.

In addition, according to this embodiment, a host chirp is an HS-mode host chirp. As a result of measuring the first voltage level information of an HS-mode host chirp and generating a determination voltage in this manner, it is possible to generate an optimum determination voltage that is based on the internal resistance of a component or the like provided on a USB route, and realize appropriate USB disconnection detection.

In addition, the circuit device 10 according to this embodiment includes the bus monitor circuit 88 that monitors the USB signal state. In addition, the physical layer circuit 12 holds the first voltage level information based on a detection signal from the bus monitor circuit 88. With such a configuration, the bus monitor circuit 88 monitors the USB signal state, and as a result of the holding circuit 40 performing a holding operation using a detection signal during a period during which a host chirp is performed, the first voltage level information can be held.

Note that, in this embodiment described above, a case has been described, as an example, in which every time device connection is made, a determination voltage for disconnection detection is generated while the circuit device 10 carries out an HS detection handshake with the device 7, but a configuration may also be adopted in which it is possible to select whether or not to carry out this processing. For example, if the level change of the determination voltage for disconnection detection is largely affected by the component configuration in the host 2 in FIG. 19, the bus routing length of internal routing, or the transmission current adjustment function of the circuit device 10, these factors are due to the configuration within the host 2, and thus are considered to be always constant. Envisioning such a case, terminals or registers for switching enable/disable of generation of a determination voltage for disconnection detection is provided in the circuit device 10. A configuration may be adopted in which, when these terminals or registers are set to "enable", a determination voltage for disconnection detection is generated as described above, and when these terminals or registers are set to "disable", a determination voltage is not generated. With such a configuration, a usage is possible in which a determination voltage for disconnection detection is generated only during factory shipment, for example, and device connection is made without generating such a determination voltage in ordinary use after that, and the convenience can be improved.

5. Electronic Device and Vehicle

Figure 23:
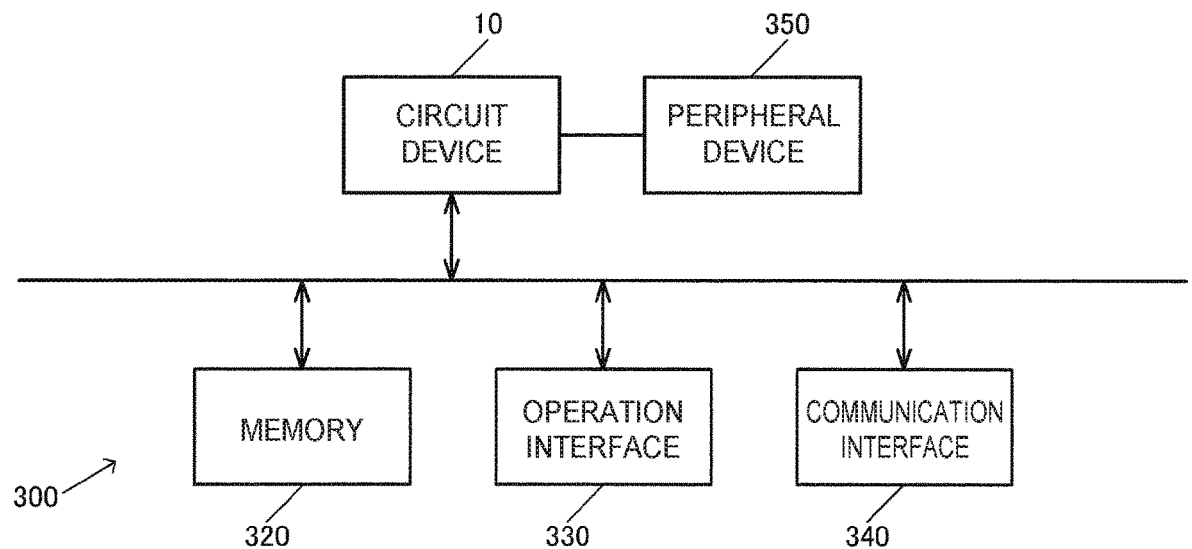
FIG. 23 shows a configuration example of an electronic device.

FIG. 23 shows a configuration example of an electronic device 300 that includes the circuit device 10 according to this embodiment. This electronic device 300 includes the circuit device 10 according to this embodiment. In the case of the configuration described with reference to FIGS. 1 to 17, the circuit device 10 functions as a host controller or a main controller, and in the case of the configuration described with reference to FIGS. 18 to 22, a host controller or a main controller that is connected to the circuit device 10 is additionally provided. The circuit device 10 is connected to a peripheral device 350 such as a mobile terminal apparatus. The circuit device 10 performs control processing of electronic device 300, various types of signal processing, and the like. A portable terminal device and the like can be envisioned as the peripheral device 350, but there is no limitation to this. The peripheral device 350 may also be a wearable device or the like.

The electronic device 300 can further include a memory 320, an operation interface 330, and a communication interface 340. The memory 320 stores, for example, data from the operation interface 330 or the communication interface 340, or functions as a work memory of the circuit device 10. The memory 320 can be realized by a semiconductor memory such as a RAM (Random Access Memory) or a ROM (Read Only Memory), or a magnetic storage device such as a hard disk drive. The operation interface 330 is a user interface that accepts various operations from a user. For example, the operation interface 330 can be realized by various buttons, a touch panel, and the like. The communication interface 340 is an interface that performs communication of various types of data such as control data and image data. The communication processing of the communication interface 340 may be wired communication processing, or may also be wireless communication processing.

Specific examples of the electronic device 300 include vehicle-mounted devices such as a car navigation device, a vehicle-mounted audio device, and an meter panel, and various electronic devices such as a projector, a head mounted display, a printing device, a portable information terminal, a portable game terminal, a robot, and an information processing apparatus. Alternatively, the electronic device 300 may be a biological information measurement device, a measurement device that measures physical quantities such as distance, time, flow rate or flow amount, a network-related device such as a base station or a router, a content providing device that distributes content, or a video device such as a digital camera or a video camera.

Figure 24:
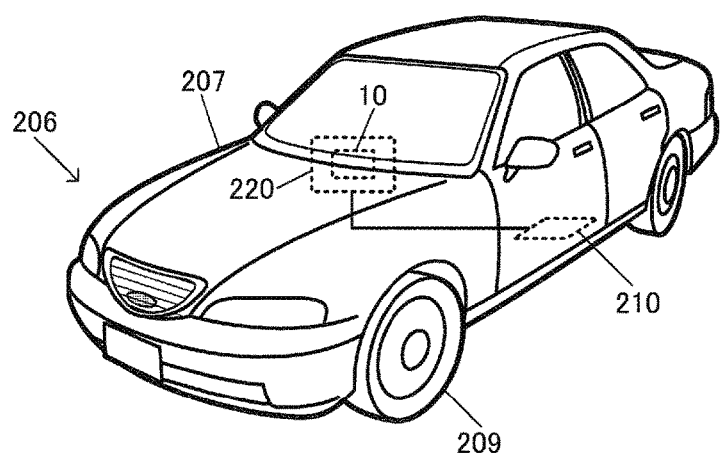
FIG. 24 shows a configuration example of a vehicle.

FIG. 24 shows a configuration example of a vehicle including the circuit device 10 of the present embodiment. The vehicle is, for example, a device or apparatus that moves on the ground, in the sky, or the sea, and is equipped with a drive mechanism such as an engine or a motor, a steering mechanism such as a steering wheel or a rudder, and various electronic devices. As the vehicle of the present embodiment, it is possible to assume, for example, a car, an airplane, a motorcycle, a ship, or alternatively a robot or the like. FIG. 24 schematically shows an automobile 206 as a specific example of the vehicle. The automobile 206 has a vehicle body 207 and wheels 209. The automobile 206 includes an in-vehicle device 220 having the circuit device 10, and a control device 210 controlling each part of the automobile 206. The control device 210 can include, for example, an ECU (Electronic Control Unit) or the like. The circuit device 10 of the present embodiment may be provided in the control device 210. The in-vehicle device 220, for example, is a car navigation device, an in-vehicle audio device, or alternatively a panel device such as an instrument panel, or the like.

As described above, the circuit device according to this embodiment includes a first physical layer circuit that is connected to a USB standard first bus, a second physical layer circuit that is connected to a USB standard second bus, and a bus switch circuit whose one end is connected to the first bus and whose other end is connected to the second bus, the bus switch circuit switching on or off connection between the first bus and the second bus. When it is assumed that voltage level information of one signal out of a DP signal and a DM signal of USB is first voltage level information, the second physical layer circuit holds the first voltage level information measured when a host chirp is transmitted to the second bus during a period during which the bus switch circuit is off. Device disconnection detection on the second bus is then performed based on the first voltage level information.

According to this embodiment, the first physical layer circuit is connected to the USB standard first bus, the second physical layer circuit is connected to the USB standard second bus, and the bus switch circuit switches on or off connection between the first bus and the second bus. The second physical layer circuit holds the first voltage level information when a host chirp is transmitted to the second bus during a period during which the bus switch circuit is off. Device disconnection detection on the second bus is then performed based on the first voltage level information held by the second physical layer circuit. If device disconnection detection is performed based on the first voltage level information when a host chirp is transmitted to the second bus during a period during which the bus switch circuit is off in this manner, device disconnection detection can be performed using an optimum determination voltage suitable for the connection environment of the second bus. Therefore, it is possible to provide a circuit device or the like that can prevent a false detection for device disconnection from being made when the device is connected, and maintain a stable connection state, as a result of setting an appropriate determination voltage for disconnection detection.

In addition, according to this embodiment, the second physical layer circuit may include an HS driver that is an HS-mode transmission circuit on the second bus, and a disconnection detection circuit that performs device disconnection detection on the second bus. The disconnection detection circuit may hold first voltage level information measured when the HS driver is transmitting a host chirp during a period during which the bus switch circuit is off, and may perform device disconnection detection based on the first voltage level information held by the disconnection detection circuit.

With such a configuration, the HS driver transmits a host chirp when the bus switch circuit is off, the first voltage level information of the DP signal or the DM signal on the second bus at that time is held, and device disconnection detection on the second bus can be realized using the first voltage level information that has been held. Therefore, it is possible to realize device disconnection detection that uses an optimum determination voltage suitable for the connection environment of the second bus.

In addition, according to this embodiment, when FS_J is detected on the second bus after USB cable attachment, the bus switch circuit may switch connection between the first bus and the second bus from on to off. In addition, the HS driver may transmit a host chirp to the second bus during a HS detection handshake period after connection between the first bus and the second bus has been switched off, and the disconnection detection circuit may hold the first voltage level information measured when the HS driver is transmitting a host chirp.

With such a configuration, as a result of connection between the first bus and the second bus being switched off when FS_J is detected on the second bus, transmission of FS_J to the first bus is prevented. In a subsequent HS detection handshake period, the first voltage level information of the second bus when the HS driver is transmitting a host chirp is held, and device disconnection detection on the second bus can be performed using a determination voltage for disconnection detection that is based on this first voltage level information.

In addition, according to this embodiment, after the HS detection handshake period ends, the bus switch circuit may switch connection between the first bus and the second bus from off to on.

With such a configuration, after the first voltage level information for disconnection detection is held during the HS detection handshake period, the first bus and the second bus are connected via the bus switch circuit. Accordingly, for example, as a result of an HS detection handshake being performed after connection between the first bus and the second bus is switched on, connection for HS communication can be established. In addition, it is also possible to realize device disconnection detection that is based on the first voltage level information that has been held.

In addition, according to this embodiment, when LS_J is detected on the second bus after cable attachment, the bus switch circuit may maintain connection between the first bus and the second bus in an on-state instead of switching the connection from on to off.

As a result of connection between the first bus and the second bus being maintained in an on-state in this manner, LS communication can be performed between the first bus and the second bus via the bus switch circuit.

In addition, according to this embodiment, if the device chirp K is not detected on the second bus during a bus reset period after cable attachment, the bus switch circuit may switch connection between the first bus and the second bus from off to on.

As a result of the bus switch circuit switching on in this manner, FS communication can be performed between the first bus and the second bus via the bus switch circuit.

In addition, according to this embodiment, the disconnection detection circuit may include a first holding circuit that holds first voltage level information, a first determination voltage generation circuit that generates a first determination voltage based on the first voltage level information, and a detection circuit that performs device disconnection detection based on the first determination voltage, and outputs a disconnection detection signal.

With such a configuration, a first determination voltage that is a determination voltage for disconnection detection is generated based on a measurement result of the voltage level of one signal out of the DP signal and the DM signal when a host chirp is transmitted, and USB disconnection detection is performed using this first determination voltage. Accordingly, an appropriate determination voltage for disconnection detection can be set for the current connection condition.

In addition, according to this embodiment, the detection circuit may include a first comparator circuit that compares the first determination voltage with the one signal, and outputs a disconnection detection signal based on a comparison result of the first comparator circuit.

If such a first comparator circuit is provided, as a result of comparing the first determination voltage set in accordance with the first voltage level information of a host chirp with the voltage of one signal out of the DP signal and the DM signal, device disconnection detection can be performed, and a disconnection detection signal can be output.

In addition, according to this embodiment, the disconnection detection circuit may include a second holding circuit that holds second voltage level information that is voltage level information of the other signal out of the DP signal and the DM signal, and has been measured when a host chirp is transmitted to the second bus, and a second determination voltage generation circuit that generates a second determination voltage based on the second voltage level information. In addition, the detection circuit may perform USB disconnection detection based on the first determination voltage and the second determination voltage, and output a disconnection detection signal.

With such a configuration, USB disconnection detection can be realized using both the first determination voltage that is based on the voltage level information of one signal out of the DP signal and the DM signal and the second determination voltage that is based on the voltage level information of the other signal, and more accurate and appropriate USB disconnection detection can be realized.

In addition, according to this embodiment, the host chirp may be an HS-mode host chirp.

As a result of measuring the first voltage level information of an HS-mode host chirp and generating a first determination voltage in this manner, it is possible to generate an optimum first determination voltage that is based on the internal resistance of a component or the like provided on the USB route, and to realize appropriate USB disconnection detection.

In addition, according to this embodiment, a bus monitor circuit that monitors a USB signal state may be included, and the second physical layer circuit may hold the first voltage level information based on a detection signal from the bus monitor circuit.

With such a configuration, the bus monitor circuit monitors the USB signal state, and, as a result of the holding circuit performing a holding operation using a detection signal during a period during which a host chirp is performed, the first voltage level information can be held.

In addition, according to this embodiment, a processing circuit that performs, when the bus switch circuit is off, transfer processing for transmitting packets received from the first bus via the first physical layer circuit, to the second bus via the second physical layer circuit, and transmitting packets received from the second bus via the second physical layer circuit, to the first bus via the first physical layer circuit may be included.

With such a configuration, as a result of the processing circuit performing predetermined signal processing when transfer processing is performed on a transfer route that passes through the processing circuit, it is possible to realize high-quality signal transfer in which degraded signal characteristics of USB transmission signals are improved.

In addition, this embodiment relates to an electronic device that includes the above-described circuit device.

In addition, this embodiment relates to a vehicle that includes the above-described circuit device.

Note that although the present embodiment has been described in detail above, it will be easily understood by those skilled in the art that many modifications that do not substantially deviate from novel matters and effects of the disclosure are possible. Accordingly, all such modifications are encompassed by the disclosure. For example, in the specification or the drawings, a term described at least once together with a different term having a broader or equivalent meaning can be replaced with the different term at any point in the specification or the drawings. Also, all combinations of the present embodiment and modifications are encompassed by the disclosure. Also, the configuration, operation, and the like of the circuit device, the electronic device, and the vehicle are not limited to those described in the present embodiment, and various modified embodiments are possible.

What is claimed is:

1. A circuit device comprising:
a high speed driver (HS driver) that is a high speed mode transmission circuit (HS mode transmission circuit) of a universal serial bus (USB); and
a disconnection detection circuit that performs disconnection detection of the USB,
wherein the disconnection detection circuit includes:
a first holding circuit that measures and holds first voltage level information that is voltage level information of one signal out of a positive data terminal (DP signal) and a negative data terminal (DM signal) of the USB when the HS driver is transmitting a host chirp,
a first determination voltage generation circuit that generates a first determination voltage based on the first voltage level information, and
a detection circuit that performs disconnection detection of the USB based on the first determination voltage, and outputs a disconnection detection signal, wherein
the first holding circuit includes a first holding register that holds, as a first detected value, the first voltage level information of the one signal when the HS driver is transmitting a high speed mode host chirp (HS-mode host chirp) as the host chirp,
the first determination voltage generation circuit generates the first determination voltage based on the first detected value,
the first holding circuit includes a second holding register that holds, as a second detected value, the first voltage level information of the one signal when the HS driver is transmitting a full speed mode host chirp (FS-mode host chirp) as the host chirp, and
the first determination voltage generation circuit generates the first determination voltage based on the first detected value and the second detected value.

2. The circuit device according to claim 1,
wherein the detection circuit includes a first comparator circuit that compares the first determination voltage with a voltage of the one signal, and
outputs the disconnection detection signal based on a comparison result of the first comparator circuit.

3. The circuit device according to claim 1,
wherein the host chirp is the HS-mode host chirp or the FS-mode host chirp.

4. The circuit device according to claim 1,
wherein the first holding circuit includes a first analog to digital conversion circuit (first A/D conversion circuit) to which the one signal is input, and
the first holding register holds an analog to digital converted value (A/D converted value) from the first A/D conversion circuit, as the first detected value.

5. The circuit device according to claim 4,
wherein the first determination voltage generation circuit includes:
a computation circuit that performs computation for obtaining the first determination voltage based on the first detected value, and
a digital to analog conversion circuit (D/A conversion circuit) that D/A-converts a computed value of the computation circuit, and thereby outputs the first determination voltage.

6. The circuit device according to claim 1,
wherein the disconnection detection circuit includes:
a second holding circuit that measures and holds second voltage level information that is voltage level information of the other signal out of the DP signal and the DM signal when the HS driver is transmitting the host chirp, and
a second determination voltage generation circuit that generates a second determination voltage based on the second voltage level information, and
the detection circuit performs disconnection detection of the USB based on the first determination voltage and the second determination voltage, and outputs the disconnection detection signal.

7. The circuit device according to claim 6,
wherein the detection circuit includes:
a first comparator circuit that compares a voltage of the one signal with the first determination voltage,
a second comparator circuit that compares a voltage of the other signal with the second determination voltage, and
an output circuit that outputs the disconnection detection signal based on comparison result signals from the first and second comparator circuits.

8. The circuit device according to claim 1, further comprising:
a bus monitor circuit that monitors a signal state of the USB,
wherein the first holding circuit holds the first voltage level information based on a detection signal from the bus monitor circuit.

9. The circuit device according to claim 1, further comprising:
a downstream port circuit that includes the HS driver and the disconnection detection circuit; and
a control circuit that controls the downstream port circuit.

10. An electronic device comprising:
the circuit device according to claim 1.

11. A vehicle comprising:
the circuit device according to claim 1.

* * * * *